(12) United States Patent
Radauscher et al.

(10) Patent No.: US 11,282,786 B2
(45) Date of Patent: Mar. 22, 2022

(54) LASER-FORMED INTERCONNECTS FOR REDUNDANT DEVICES

(71) Applicant: X Display Company Technology Limited, Dublin (IE)

(72) Inventors: Erich Radauscher, Raleigh, NC (US); Ronald S. Cok, Rochester, NY (US); Matthew Alexander Meitl, Durham, NC (US); Christopher Andrew Bower, Raleigh, NC (US); Christopher Michael Verreen, Raleigh, NC (US); Erik Paul Vick, Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 16/702,352

(22) Filed: Dec. 3, 2019

(65) Prior Publication Data

US 2020/0194370 A1 Jun. 18, 2020

Related U.S. Application Data

(60) Provisional application No. 62/778,519, filed on Dec. 12, 2018.

(51) Int. Cl.
*H01L 23/525* (2006.01)
*H01L 23/528* (2006.01)
(Continued)

(52) U.S. Cl.
CPC ........ *H01L 23/5258* (2013.01); *H01L 23/528* (2013.01); *H01L 23/544* (2013.01); *H01L 27/124* (2013.01)

(58) Field of Classification Search
None
See application file for complete search history.

(56) References Cited

U.S. PATENT DOCUMENTS 4,678,282 A * 7/1987 Yaniv ............... G02F 1/13624
257/55
5,550,066 A 8/1996 Tang et al.
(Continued)

FOREIGN PATENT DOCUMENTS

WO WO-2014/0149864 A1 9/2014

OTHER PUBLICATIONS

Bower, C. A. et al., Emissive displays with transfer-printed assemblies of 8 μm x 15 μm inorganic light-emitting diodes, Photonics Research, 5(2):A23-A29, (2017).
(Continued)

*Primary Examiner* — Julio J Maldonado
*Assistant Examiner* — Lawrence C Tynes, Jr.
(74) *Attorney, Agent, or Firm* — Choate, Hall & Stewart LLP; Michael D. Schmitt

(57) ABSTRACT

A parallel redundant system comprises a substrate, a first circuit disposed over the substrate, a first conductor disposed at least partially in a first layer over the substrate and wire routed to the first circuit, a second circuit disposed over the substrate, the second circuit redundant to the first circuit, a second conductor disposed in a second layer over the substrate and electrically connected to the second circuit, the second conductor disposed at least partially over the first conductor, a dielectric layer disposed at least partially between the first layer and the second layer, and a laser weld electrically connecting the first conductor to the second conductor.

26 Claims, 21 Drawing Sheets

(51) Int. Cl.
*H01L 23/544* (2006.01)
*H01L 27/12* (2006.01)

(56) References Cited

U.S. PATENT DOCUMENTS

| | | | |
|---|---|---|---|
| 5,621,555 A | 4/1997 | Park | |
| 6,142,358 A | 11/2000 | Cohn et al. | |
| 6,577,367 B2 | 6/2003 | Kim | |
| 7,012,382 B2 | 3/2006 | Cheang et al. | |
| 7,195,733 B2 | 3/2007 | Rogers et al. | |
| 7,354,801 B2 | 4/2008 | Sugiyama et al. | |
| 7,417,692 B2 | 8/2008 | Lin | |
| 7,521,292 B2 | 4/2009 | Rogers et al. | |
| 7,557,367 B2 | 7/2009 | Rogers et al. | |
| 7,622,367 B1 | 11/2009 | Nuzzo et al. | |
| 7,662,545 B2 | 2/2010 | Nuzzo et al. | |
| 7,704,684 B2 | 4/2010 | Rogers et al. | |
| 7,799,699 B2 | 9/2010 | Nuzzo et al. | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 8,333,860 B1 | 12/2012 | Bibl et al. | |
| 8,470,701 B2 | 6/2013 | Rogers et al. | |
| 8,506,867 B2 | 8/2013 | Menard | |
| 8,558,243 B2 | 10/2013 | Bibl et al. | |
| 8,722,458 B2 | 5/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,835,940 B2 | 9/2014 | Hu et al. | |
| 8,865,489 B2 | 10/2014 | Rogers et al. | |
| 8,877,648 B2 | 11/2014 | Bower et al. | |
| 8,889,485 B2 | 11/2014 | Bower | |
| 8,934,259 B2 | 1/2015 | Bower et al. | |
| 8,941,215 B2 | 1/2015 | Hu et al. | |
| 8,987,765 B2 | 3/2015 | Bibl et al. | |
| 9,049,797 B2 | 6/2015 | Menard et al. | |
| 9,087,764 B2 | 7/2015 | Chan et al. | |
| 9,105,714 B2 | 8/2015 | Hu et al. | |
| 9,111,464 B2 | 8/2015 | Bibl et al. | |
| 9,139,425 B2 | 9/2015 | Vestyck | |
| 9,153,171 B2 | 10/2015 | Sakariya et al. | |
| 9,161,448 B2 | 10/2015 | Menard et al. | |
| 9,165,989 B2 | 10/2015 | Bower et al. | |
| 9,166,114 B2 | 10/2015 | Hu et al. | |
| 9,178,123 B2 | 11/2015 | Sakariya et al. | |
| 9,217,541 B2 | 12/2015 | Bathurst et al. | |
| 9,240,397 B2 | 1/2016 | Bibl et al. | |
| 9,252,375 B2 | 2/2016 | Bibl et al. | |
| 9,355,854 B2 | 5/2016 | Meitl et al. | |
| 9,358,775 B2 | 6/2016 | Bower et al. | |
| 9,367,094 B2 | 6/2016 | Bibl et al. | |
| 9,412,727 B2 | 8/2016 | Menard et al. | |
| 9,478,583 B2 | 10/2016 | Hu et al. | |
| 9,484,504 B2 | 11/2016 | Bibl et al. | |
| 9,520,537 B2 | 12/2016 | Bower et al. | |
| 9,555,644 B2 | 1/2017 | Rogers et al. | |
| 9,583,533 B2 | 2/2017 | Hu et al. | |
| 9,589,944 B2 | 3/2017 | Higginson et al. | |
| 9,601,356 B2 | 3/2017 | Bower et al. | |
| 9,640,715 B2 | 5/2017 | Bower et al. | |
| 9,716,082 B2 | 7/2017 | Bower et al. | |
| 9,761,754 B2 | 9/2017 | Bower et al. | |
| 9,765,934 B2 | 9/2017 | Rogers et al. | |
| 9,865,832 B2 | 1/2018 | Bibl et al. | |
| 9,929,053 B2 | 3/2018 | Bower et al. | |
| 10,255,834 B2 | 4/2019 | Cok et al. | |
| 10,395,582 B2 | 8/2019 | Cok et al. | |
| 2003/0141570 A1 | 7/2003 | Chen et al. | |
| 2004/0263460 A1* | 12/2004 | Lu | G09G 3/3648 345/98 |
| 2006/0160261 A1* | 7/2006 | Sheats | H01L 31/0392 438/34 |
| 2010/0306993 A1 | 12/2010 | Mayyas et al. | |
| 2013/0309792 A1 | 11/2013 | Tischler et al. | |
| 2013/0316487 A1 | 11/2013 | de Graff et al. | |
| 2014/0159043 A1 | 6/2014 | Sakariya et al. | |
| 2016/0093600 A1 | 3/2016 | Bower et al. | |
| 2017/0025075 A1* | 1/2017 | Cok | G09G 3/32 |
| 2017/0338374 A1 | 11/2017 | Zou et al. | |
| 2018/0167575 A1* | 6/2018 | Watanabe | H04N 5/378 |
| 2018/0301589 A1* | 10/2018 | Burroughs | F21V 5/041 |
| 2019/0115287 A1* | 4/2019 | Derai | H01L 23/49589 |

OTHER PUBLICATIONS

Bower, C. A. et al., Micro-Transfer-Printing: Heterogeneous Integration of Microscale Semiconductor Devises using Elastomer Stamps, IEEE Conference, (2014).
Bower, C. A. et al., Transfer Printing: An Approach for Massively Parallel Assembly of Microscale Devices, IEEE, Electronic Components and Technology Conference, (2008).
Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of SID, 19(4):335-341, (2011).
Cok, R. S. et al., Inorganic light-emitting diode displays using micro-transfer printing, Journal of the SID, 25(10):589-609, (2017).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties, American Chemical Society, Langmuir, 12(19):4492-4496, (1996).
Hamer, J. W. et al., 63:2: AMOLED Displays using Transfer-Printed Integrated Circuits, SID, 09:947-950, (2009).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Trindade, A.J. et al., Precision transfer printing of ultra-thin AlInGaN micron-size light-emitting diodes, Crown, pp. 217-218, (2012).

* cited by examiner

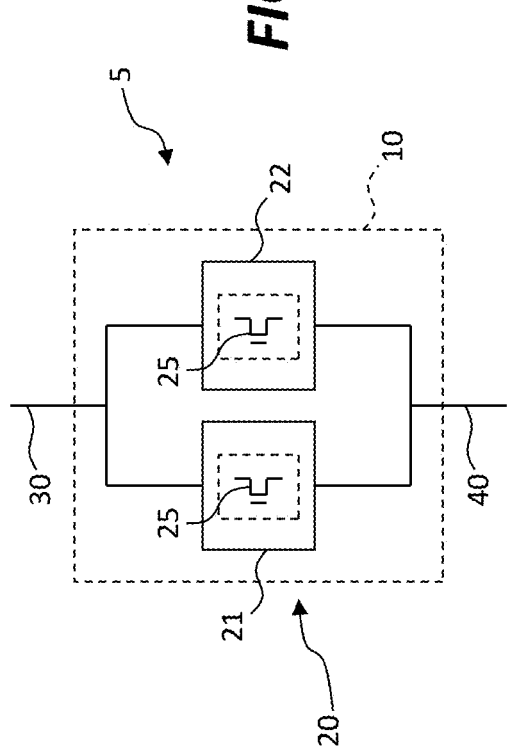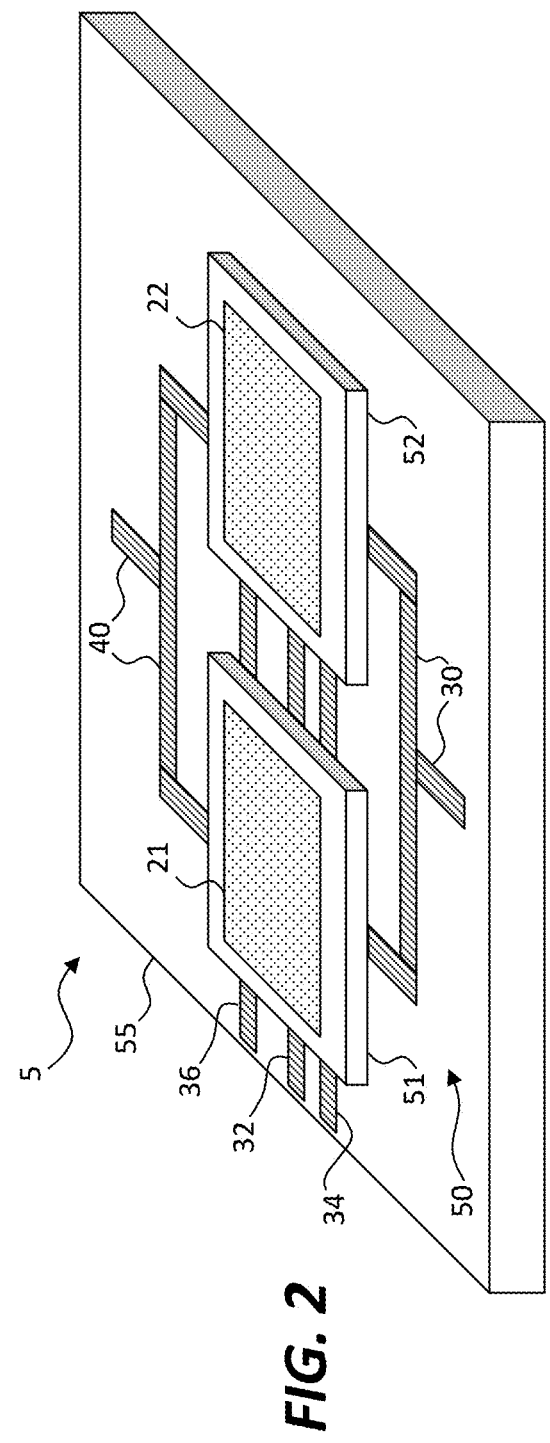

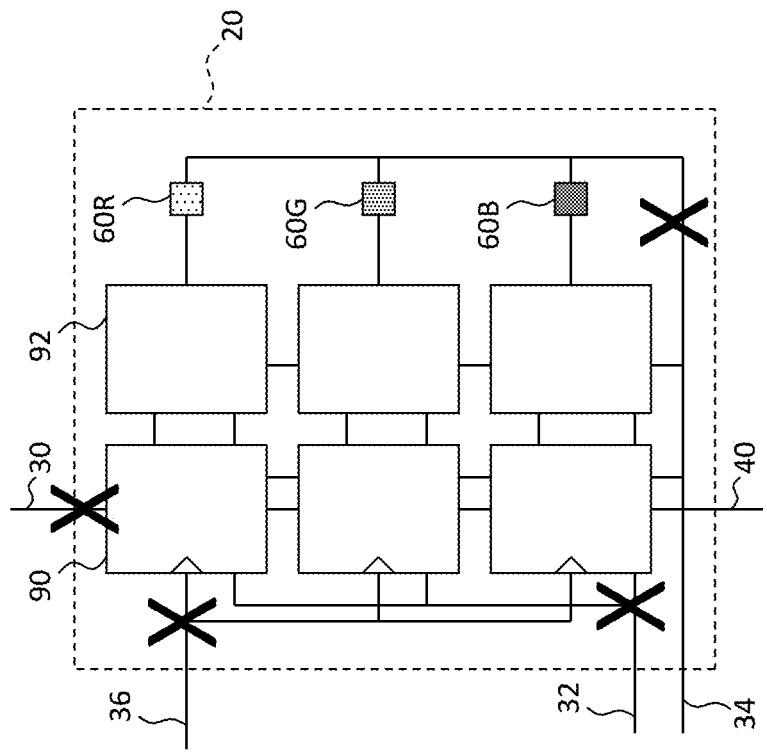
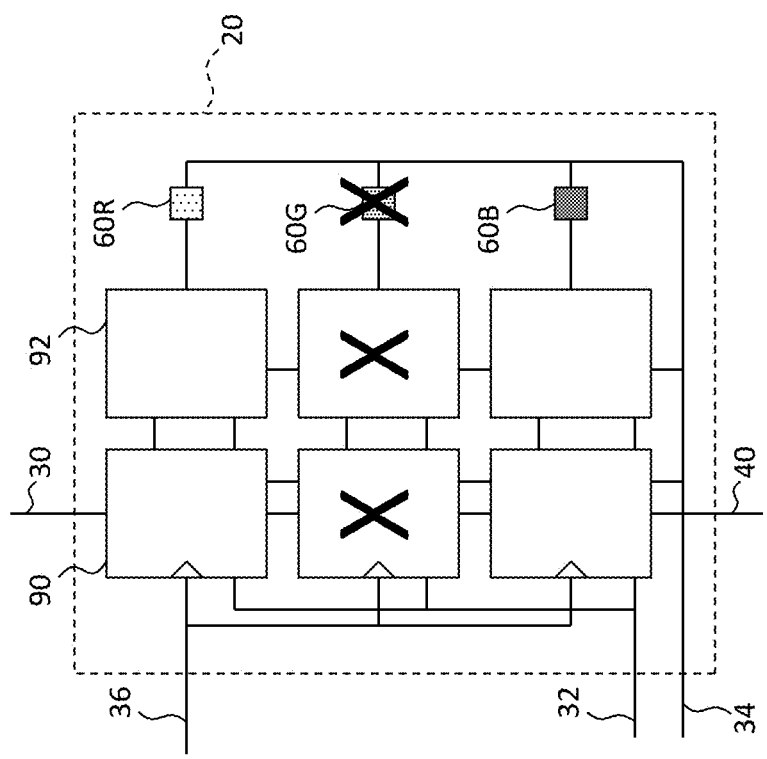

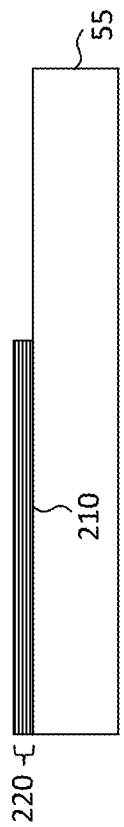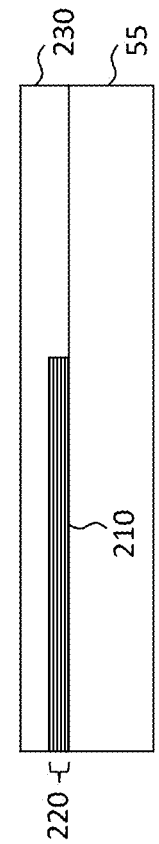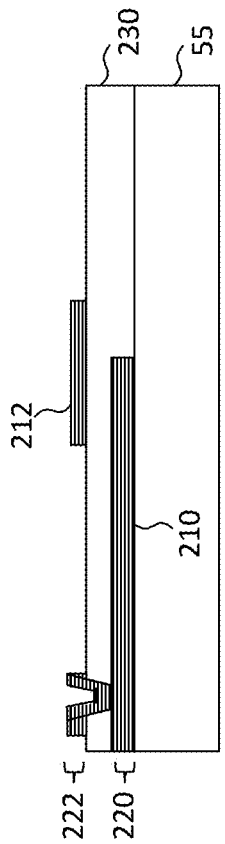

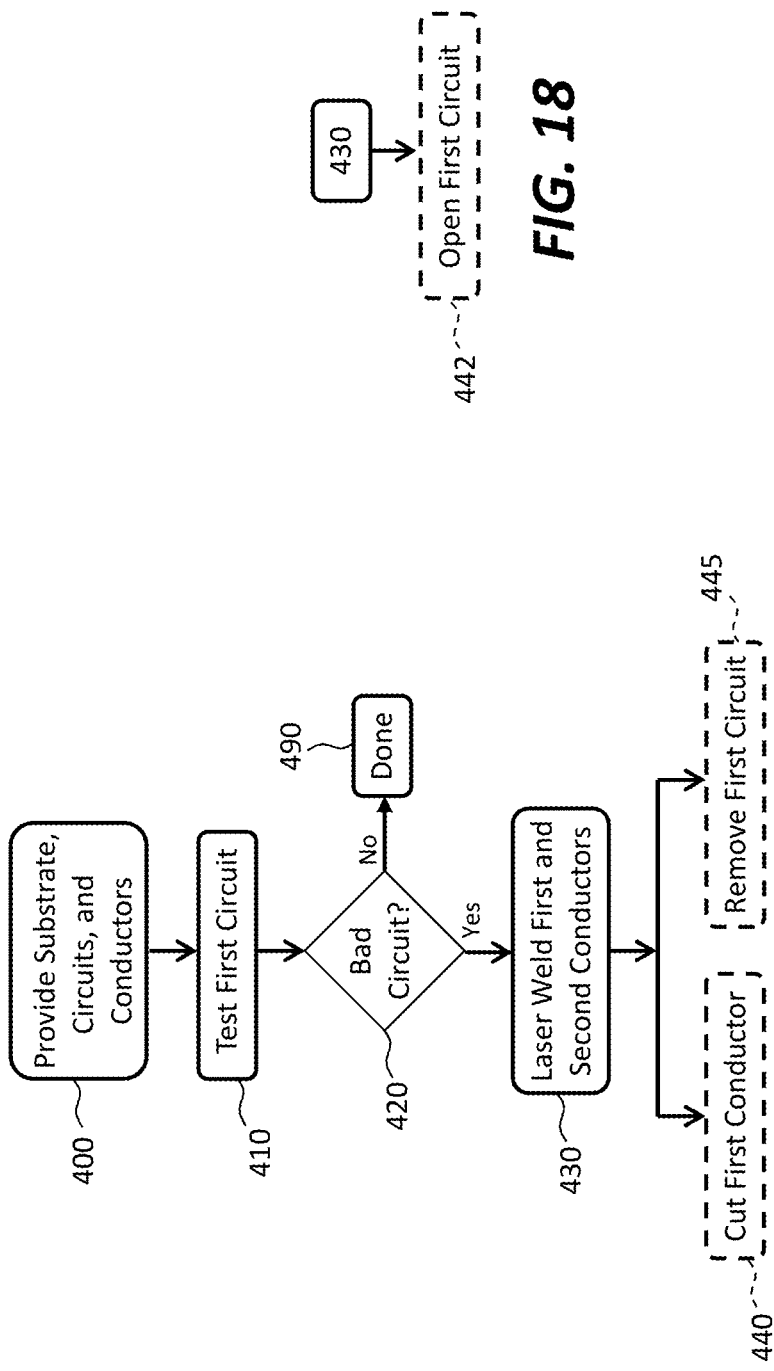

LASER-FORMED INTERCONNECTS FOR REDUNDANT DEVICES

PRIORITY APPLICATION

This application claims the benefit of U.S. Provisional Patent Application Ser. No. 62/778,519, filed on Dec. 12, 2018, the disclosure of which is hereby incorporated by reference herein in its entirety.

CROSS REFERENCE TO RELATED APPLICATIONS

Reference is made to U.S. patent application Ser. No. 14/807,226, filed on Jul. 23, 2015, entitled Parallel Redundant Chiplet System by Cok et al. and to U.S. patent application Ser. No. 16/054,823, filed on Aug. 3, 2018, entitled Parallel Redundant Chiplet System by Cok et al, the disclosure of each of which is hereby incorporated herein by reference in its entirety.

TECHNICAL FIELD

The present disclosure relates to circuit systems having redundant elements and methods for interconnecting elements therein.

BACKGROUND

Flat-panel displays are widely used in conjunction with computing devices, in portable devices, and for entertainment devices such as televisions. Such displays typically employ a plurality of pixels distributed over a display substrate to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode (OLED) displays rely on passing current through a layer of organic material that glows in response to the current. Displays using inorganic light emitting diodes (LEDs) are also in widespread use for outdoor signage and have been demonstrated in a 55-inch television.

Inorganic light-emitting diode displays using inorganic micro-LEDs on a display substrate are also known. Micro-LEDs can have an area less than 1 mm square, less than 100 microns square, or less than 50 microns square or have an area small enough that it is not visible to an unaided observer of the display at a designed viewing distance. U.S. Pat. No. 8,722,458 entitled Optical Systems Fabricated by Printing-Based Assembly teaches transferring light-emitting, light-sensing, or light-collecting semiconductor elements from a wafer substrate to a destination substrate.

Displays are typically controlled with either a passive-matrix (PM) control employing electronic circuitry external to the display substrate or an active-matrix (AM) control employing electronic circuitry formed directly on the display substrate and associated with each light-emitting element. Both OLED displays and LCDs using passive-matrix control and active-matrix control are available. An example of such an AM OLED display device is disclosed in U.S. Pat. No. 5,550,066.

Typically, each display sub-pixel is controlled by one control element, and each control element includes at least one transistor. For example, in a simple active-matrix organic light-emitting diode (OLED) display, each control element includes two transistors (a select transistor and a power transistor) and one capacitor for storing a charge specifying the luminance of the sub-pixel. Each OLED element employs an independent control electrode connected to the power transistor and a common electrode. In contrast, an LCD typically uses a single transistor to control each pixel. Control of the light-emitting elements is usually provided through a data signal line, a select signal line, a power connection and a ground connection. Active-matrix elements are not necessarily limited to displays and can be distributed over a substrate and employed in other applications requiring spatially distributed control.

Active-matrix circuits are commonly constructed with thin-film transistors (TFTs) in a semiconductor layer formed over a display substrate and employing a separate TFT circuit to control each light-emitting pixel in the display. The semiconductor layer is typically amorphous silicon or polycrystalline silicon and is distributed over the entire flat-panel display substrate. The semiconductor layer is photolithographically processed to form electronic control elements, such as transistors and capacitors. Additional layers, for example insulating dielectric layers and conductive metal layers are provided, often by evaporation or sputtering, and photolithographically patterned to form electrical interconnections, or wires.

Active-matrix circuits are also constructed using active components transferred from one substrate to another, for example as described in U.S. Pat. No. 8,722,458 referenced above and AMOLED Displays using Transfer-Printed Integrated Circuits published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline semiconductor wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured.

In any application requiring many elements, it is important that each element is reliable to ensure good manufacturing yields and performance. Active-matrix control circuits, as well as the controlled element (e.g., a light emitter) are subject to failure.

Because no manufacturing process is perfect, any large system can have defective elements.

One method of improving manufacturing yields relies on repairing backplanes. For example, U.S. Pat. No. 7,417,692 dated Aug. 26, 2008 entitled Laser Repair Structure and Method for TFT-LCD by Lin describes pixel defect repair using laser irradiation. The company Coherent provides laser repair tools that can cut conductive wires, weld conductive wires together, and remove point defects, for example as described in *Flat Panel Display Defect Repair Using High Peak-Power Picosecond Lasers* (available from www.coherent.co.jp/document/docs/Talisker_flat_panel.pdf). Although this technique enables conductive wire repair, it does not address faulty, misplaced, or missing control circuits.

To ensure that large multi-element systems are reliably manufactured and operated, systems can employ redundant elements. For example, displays are sometimes designed with redundant light emitters. U.S. Pat. No. 5,621,555 describes an LCD with redundant pixel electrodes and thin-film transistors to reduce defects. In another approach described in U.S. Pat. No. 6,577,367, an extra row or column of pixels is provided to replace any defective row or column.

An alternative approach to improving display yields uses additional, redundant light-emitting elements, for example two light emitters for every desired light emitter in the display. U.S. Pat. No. 8,766,970 discloses a pixel circuit with two sub-pixels and circuitry to determine whether a sub-pixel is to be enabled, for example if another sub-pixel is faulty. Similarly, U.S. Pat. No. 7,012,382 teaches an LED-based light system that includes a primary light source and at least one redundant light source. The primary light source is activated by itself and the performance of the light source is measured to determine whether or not to drive the redundant light source. The redundant light source is activated when the performance measurements indicate that a performance characteristic is not being met by the primary light source alone. The first light system can be activated in combination with the redundant light source once the decision is made to activate the redundant light source. U.S. Pat. No. 8,791,474 discloses redundant pairs of LED devices driven by a common transistor. WO 2014149864 describes separately controlled LED devices.

Thus, some prior-art designs use additional test or control circuits that require additional space over a substrate to switch between one element and a redundant element, if the one element is faulty. Other prior-art designs have a common controller or driver that can fail. Therefore, these arrangements do not address faults in the control circuits as well as in the light emitters and there remains a need for systems with improved reliability and simple structures.

SUMMARY

The present disclosure includes, among other things, embodiments of an integrated-circuit system with parallel redundancy in a simple structure amenable to manufacturing (e.g., with micro transfer printing). An integrated-circuit system can include redundant circuits with the same functionality that can be provided on separate substrates and can be connected in parallel so that each corresponding input of the redundant circuits are connected together and each corresponding output of the redundant circuits are connected together. In some embodiments, a system provides redundancy in the presence of printing faults without requiring interconnections between the redundant circuits or control or test circuits for selecting between the redundant circuits and is therefore simple to construct and operate. Redundant circuits can include light emitters and, in some embodiments, are suitable for forming a display using micro transfer printing.

In some aspects, the present disclosure is directed to a parallel redundant integrated-circuit system, the system including: a common input connection; a common output connection; a first active circuit comprising one or more first integrated circuits, the first active circuit having an input connected to the common input connection and an output connected to the common output connection; and a second active circuit comprising one or more second integrated circuits, the second active circuit redundant to the first active circuit and having an input connected to the common input connection and an output connected to the common output connection, wherein the one or more second integrated circuits are separate and distinct from the one or more first integrated circuits.

In certain embodiments, the common input or common output connection is a signal connection.

In certain embodiments, the signal connection is a clock signal connection, a data signal connection, an analog signal connection, or a digital signal connection.

In certain embodiments, the system includes a plurality of common input connections that comprises the common input connection.

In certain embodiments, the system includes a power connection connected to a power input of the first active circuit and a power input of the second active circuit.

In certain embodiments, the system includes a plurality of common output connections that comprises the common output connection.

In certain embodiments, the common input connection is connected to the common output connection through the first and second active circuits or wherein the first and second active circuits include a signal-transfer element and the common input connection is connected to the common output connection through the signal-transfer element.

In certain embodiments, the first active circuit comprises a first light emitter and the second active circuit comprises a second light emitter.

In certain embodiments, the first active circuit comprises a first driver circuit and the second active circuit comprises a second driver circuit.

In certain embodiments, the first active circuit comprises a first red-light emitter that emits red light, a first green-light emitter that emits green light, and a first blue-light emitter that emits blue light; the first driver circuit comprises a first red driver circuit driving the first red-light emitter, a first green driver circuit driving the first green-light emitter, and a first blue driver circuit driving the first blue-light emitter; the second active circuit comprises a second red-light emitter that emits red light, a second green-light emitter that emits green light, and a second blue-light emitter that emits blue light; and the second driver circuit comprises a second red driver circuit driving the second red-light emitter, a second green driver circuit the second green-light emitter, and a second blue driver circuit driving the second blue-light emitter.

In certain embodiments, the first driver circuit comprises a first bit-to-current convertor and the second driver circuit comprises a second bit-to-current convertor.

In certain embodiments, the first active circuit comprises a first storage element and the second active circuit comprises a second storage element.

In certain embodiments, the system includes a third active circuit comprising one or more third integrated circuits, the third active circuit redundant to the first and second active circuits and having an input connected to the common input connection and an output connected to the common output connection, the third integrated circuits separate and distinct from the first and second integrated circuits.

In certain embodiments, the common input connection, the common output connection, the first active circuit, and the second active circuit form a component group, and the parallel redundant integrated-circuit system comprising a plurality of component groups.

In certain embodiments, the plurality of component groups comprises a first component group and a second component group and wherein the common output connection of the first component group is connected to the common input connection of the second component group.

In certain embodiments, the first and second active circuits of each component group of the plurality of component groups each comprise one or more light emitters.

In certain embodiments, the system includes a controller connected to the plurality of component groups for providing control signals thereto.

In certain embodiments, the second active circuit of at least one component group of the plurality of component groups is a failed active circuit and further including a controller for providing control signals to the plurality of component groups.

In certain embodiments, the system includes a substrate on which the array of component groups are disposed.

In certain embodiments, the substrate is a member selected from the group consisting of polymer, plastic, resin, polyimide, PEN, PET, metal, metal foil, glass, a semiconductor, and sapphire.

In certain embodiments, the substrate has a transparency of at least 50% (e.g., at least 80%, at least 90%, or at least 95%) for visible light.

In certain embodiments, the substrate has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

In some aspects, the present disclosure is directed to a parallel redundant integrated-circuit system, the system including: a common input connection; a first active circuit comprising one or more first integrated circuits and at least one light emitter, the first active circuit having an input connected to the common input connection; a second active circuit comprising one or more second integrated circuits and at least one light emitter, the second active circuit redundant to the first active circuit and having an input connected to the common input connection; and wherein the second integrated circuits are separate and distinct from the first integrated circuits.

In certain embodiments, the at least one light emitter of the first active circuit comprises a first red-light emitter that emits red light, a first green-light emitter that emits green light, and a first blue-light emitter that emits blue light; and the at least one light emitter of the second active circuit comprises a second red-light emitter that emits red light, a second green-light emitter that emits green light, and a second blue-light emitter that emits blue light.

In certain embodiments, the parallel redundant integrated-circuit system is a display.

In certain embodiments, the input is a signal connection.

In certain embodiments, the signal connection is a clock signal connection, a data signal connection, an analog signal connection, or a digital signal connection.

In certain embodiments, the system includes a plurality of common input connections that comprises the common input connection.

In certain embodiments, the system includes a power connection connected to a power input of the first active circuit and a power input of the second active circuit.

In certain embodiments, the first active circuit comprises a first driver circuit and the second active circuit comprises a second driver circuit.

In certain embodiments, the first active circuit comprises a first red-light emitter that emits red light, a first green-light emitter that emits green light, and a first blue-light emitter that emits blue light; the first driver circuit comprises a first red driver circuit driving the first red-light emitter, a first green driver circuit driving the first green-light emitter, and a first blue driver circuit driving the first blue-light emitter; the second active circuit comprises a second red-light emitter that emits red light, a second green-light emitter that emits green light, and a second blue-light emitter that emits blue light; and the second driver circuit comprises a second red driver circuit driving the second red-light emitter, a second green driver circuit the second green-light emitter, and a second blue driver circuit driving the second blue-light emitter.

In certain embodiments, the first driver circuit comprises a first bit-to-current convertor and the second driver circuit comprises a second bit-to-current convertor.

In certain embodiments, the first active circuit comprises a first storage element and the second active circuit comprises a second storage element.

In certain embodiments, the system includes a third active circuit comprising one or more third integrated circuits, the third active circuit redundant to the first and second active circuits and having an input connected to the common input connection, the third integrated circuits separate and distinct from the first and second integrated circuits.

In certain embodiments, the common input connection, the first active circuit, and the second active circuit form a component group, and the parallel redundant integrated-circuit system comprising a plurality of component groups.

In certain embodiments, the system includes a controller connected to the plurality of component groups for providing control signals thereto.

In certain embodiments, the second active circuit of at least one component group of the plurality of component groups is a failed active circuit and further including a controller for providing control signals to the plurality of component groups.

In certain embodiments, the system includes a substrate on which the array of component groups are disposed.

In certain embodiments, the substrate is a member selected from the group consisting of polymer, plastic, resin, polyimide, PEN, PET, metal, metal foil, glass, a semiconductor, and sapphire.

In certain embodiments, substrate has a transparency of at least 50% (e.g., at least 80%, at least 90%, or at least 95%) for visible light.

In certain embodiments, the substrate has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

In some aspects, the present disclosure is directed to a method of calibrating a parallel redundant integrated-circuit system, the method including: providing, by a controller having a memory, a control signal to a plurality of component groups each having a first active circuit and a second active circuit, wherein: each first active circuit comprises a first light emitter and has an input connected to a common input connection and an output connected to a common output connection; and each second active circuit comprises a second light emitter, wherein the second active circuit is redundant to the first active circuit, the second active circuit has an input connected to the common input connection and an output connected to the common output connection, and the second light emitter is separate and distinct from the first light emitter; measuring, by a light measurement and calibration device, light emitted from the component groups; and determining, by the light measurement and calibration device, that the light emitted by a first component group is less than the light emitted by a second component group; storing, in the controller memory, a first calibration value for the first component group and used to calibrate a control signal so that the light emitted light by the first component group is substantially the same as the light emitted by the second component group when the control signal is provided in common to a plurality of component groups including a faulty component group.

In certain embodiments, the first calibration value for a light emitter in the first component group is a factor of two of a second calibration value for a corresponding light emitter in the second component group.

In some aspects, the present disclosure is directed to a parallel redundant integrated-circuit display, the display comprising: an array of component groups, each component group having one or more integrated circuits and two or more redundant light emitters having a common input connection and a common output connection, wherein the one or more integrated circuits respond to control signals to drive the two or more light emitters in parallel to emit light, and wherein the two or more redundant light emitters are separate and distinct from each other.

In certain embodiments, the component groups comprise: one or more red-light component groups, the two or more redundant light emitters in each red-light component group comprising two or more redundant red-light emitters that emit red light and have a common input and a common output; one or more green-light component groups, the two or more redundant light emitters in each green-light component group comprising two or more redundant green-light emitters that emit green light and have a common input and a common output; and one or more blue-light component groups, the two or more redundant light emitters in each blue-light component group comprising two or more redundant blue-light emitters that emit blue light and have a common input and a common output.

In certain embodiments, the array of component groups includes 40,000, 62,500, 100,000, 500,000, one million, two million, three million, six million or more component groups.

In certain embodiments, the display includes a display substrate on which the array of component groups are disposed.

In certain embodiments, the display substrate is a member selected from the group consisting of polymer, plastic, resin, polyimide, PEN, PET, metal, metal foil, glass, a semiconductor, and sapphire.

In certain embodiments, display substrate has a transparency of at least 50% (e.g., at least 80%, at least 90%, or at least 95%) for visible light.

In certain embodiments, the display substrate has a contiguous display substrate area, the plurality of light emitters each have a light-emissive area, and the combined light-emissive areas of the plurality of light emitters is less than or equal to one-quarter of the contiguous display substrate area.

In certain embodiments, the combined light-emissive areas of the plurality of light emitters is less than or equal to one eighth, one tenth, one twentieth, one fiftieth, one hundredth, one five-hundredth, one thousandth, one two-thousandth, or one ten-thousandth of the contiguous display substrate area.

In certain embodiments, each of the plurality of light emitters has a width from 2 μm to 50 μm (e.g., 2 to 5 μm, 5 to 10 μm, 10 to 20 μm, or 20 to 50 μm).

In certain embodiments, each of the plurality of light emitters has a length from 2 μm to 50 μm (e.g., 2 to 5 μm, 5 to 10 μm, 10 to 20 μm, or 20 to 50 μm).

In certain embodiments, each of the plurality of light emitters has a height from 2 μm to 50 μm (e.g., 2 to 5 μm, 5 to 10 μm, 10 to 20 μm, or 20 to 50 μm).

In certain embodiments, the display substrate has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

In some embodiments, a parallel redundant system comprises a substrate, a first circuit disposed over the substrate, a first conductor disposed at least partially in a first layer over the substrate and wire routed to the first circuit, a second circuit disposed over the substrate, the second circuit redundant to the first circuit, a second conductor disposed in a second layer over the substrate and electrically connected to the second circuit, the second conductor disposed at least partially over the first conductor, a dielectric layer disposed at least partially between the first layer and the second layer (e.g., at least partially between the first conductor and the second conductor), and a laser weld electrically connecting the first conductor to the second conductor through the dielectric layer.

In some embodiments, an interface circuit is electrically connected to the first conductor and to the second circuit through the laser weld. In some embodiments, the first conductor is continuous and electrically connects the interface circuit to the first circuit. In some embodiments, the first conductor is discontinuous, for example has been cut, and does not electrically connect the interface circuit to the first circuit.

In some embodiments at least one of the first circuit and the second circuit is an integrated circuit. The integrated circuit can comprise an unpackaged semiconductor circuit and a broken or separated tether. The integrated circuit can comprise an electrically opening structure (e.g., a fuse). The integrated circuit can comprise an electrically shorting structure.

In some embodiments, the parallel redundant system comprises two or more first conductors disposed in the first layer wire routed to the first circuit and two or more second conductors disposed in the second layer each second conductor electrically connected to the second circuit. In some embodiments, two or more laser welds each electrically connect one of the two or more first conductors to a corresponding one of the two or more second conductors. In some embodiments, two or more laser welds electrically both connect one of the two or more first conductors to a corresponding same one of the two or more second conductors. In some embodiments, one or more of the two or more first conductors is electrically connected to a corresponding one of the two or more second conductors.

In some embodiments, the first circuit provides an electrical short circuit or an electrical open between two of the two or more first conductors, two or more second conductors, or between one or more first conductors and one or more second conductors.

In some embodiments, the first circuit is not disposed directly on the substrate, is not disposed on a layer over the substrate, or is not disposed on the substrate.

In some embodiments, a method of making a parallel redundant system comprises providing a substrate, a first circuit disposed over the substrate, a second circuit disposed over the substrate, a first conductor disposed at least partially in a first layer over the substrate and wire routed to the first conductor, a second conductor disposed in a second layer over the substrate and electrically connected to the second circuit, the second conductor at least partially over the first conductor, and a dielectric layer disposed at least partially between the first layer and the second layer such that the first conductor is electrically insulated from the second conductor and laser welding the first conductor to the second conductor where the second conductor is over the first conductor to form a laser weld that electrically connects the second conductor to the first conductor through the dielectric layer.

In some embodiments, a method comprises testing the first circuit and laser welding if the first circuit is determined to be at least one of defective, misplaced, misaligned, and missing. In some embodiments, the method comprises cutting the first conductor, for example cutting the first conductor electrically between the laser weld and the first circuit along a current path of the first conductor. In some embodiments, the first conductor is cut before laser welding or the first conductor is cut after laser welding.

In some embodiments, the method comprises (i) disposing the first circuit over the substrate by micro-transfer printing the first circuit, (ii) disposing the second circuit over the substrate by micro-transfer printing the second circuit, or (iii) both (i) and (ii).

Some embodiments of the present disclosure comprise testing the first circuit and disposing the second circuit over the substrate after the first circuit is tested. Some embodiments comprise providing two or more first conductors and the method comprises processing the first circuit to form a short circuit between two of the two or more first conductors. Some embodiments of the present disclosure comprise providing two or more first conductors and the method comprises processing the first circuit to form an open between two of the two or more first conductors. In some embodiments of the present disclosure, the first circuit is disposed on the substrate and some methods comprise removing the first circuit from the substrate.

In some embodiments of the present disclosure, a processable integrated circuit comprises an integrated circuit substrate, a circuit disposed in, on, or over the integrated circuit substrate, an electrical connector electrically connected to the circuit, and an opening structure serially electrically connected between the electrical connector and the circuit, wherein the opening structure is constructed (e.g., sized and shaped) to form an electrical open when subjected to laser radiation.

In some embodiments, the processable integrated circuit comprises a graphic indicating the location of the opening structure. In some embodiments, the processable integrated circuit comprises a package containing the integrated circuit substrate and wherein the electrical connector comprises an interconnection lead. In some embodiments, a graphic is disposed on the package, the graphic indicating the location of the opening structure.

In some embodiments, the opening structure is an electrical conductor disposed on, in, or over the integrated circuit substrate that electrically connects the interconnection lead to the circuit. The opening structure can be a thermally activated fuse.

In some embodiments of the present disclosure, a method for processing an integrated circuit comprises providing an integrated circuit substrate, a circuit disposed in, on, or over the integrated circuit substrate, an electrical connector electrically connected to the circuit, and an opening structure electrically connected in serial between the electrical connector and the circuit, and exposing the opening structure to laser radiation, thereby forming an electrical open between the circuit and the electrical connector.

In some embodiments of the present disclosure, a processable integrated circuit comprises an integrated circuit, a circuit disposed in, on, or over the integrated circuit substrate, an electrical input connector electrically connected to the circuit, an electrical output connector electrically connected to the circuit, and a shorting structure provided in electrical contact with the electrical input connector and provided in electrical contact with the electrical output connector, wherein the shorting structure is constructed (e.g., sized and shaped) to form an electrical short when subjected to laser radiation.

In some embodiments, the shorting structure is disposed in, on, or over the integrated circuit substrate. In some embodiments, a processable integrated circuit comprises an integrated circuit package containing the integrated circuit substrate and wherein the electrical input connector is a package input lead and wherein the electrical output connector is a package output lead. The shorting structure can be disposed in, on, or over the package or in a package cavity in which the integrated circuit is disposed. A graphic can be disposed on the package, the graphic indicating the location of the shorting structure. A graphic can indicate the location of the shorting structure and can be located on the integrated circuit package.

In some embodiments, the shorting structure comprises a shorting conductor wherein the shorting conductor is: (i) electrically connected to the input connector and extending toward the output connector and separated from the output connector by a distance equal to or less than one mm, (ii) electrically connected to the output connector and extending toward the input connector and separated from the input connector by a distance equal to or less than one mm, or (iii) both (i) and (ii). In some embodiments, the shorting conductor comprises (iii) both (i) and (ii) and the shorting conductor electrically connected to the input connector and the shorting conductor electrically connected to the output connector are interdigitated. In some embodiments, the shorting conductor electrically connected to the input connector is separated from the output connector by a distance of no more than 500 microns (e.g., no more than 100 microns, no more than 50 microns, or no more than 5 microns). In some embodiments, the shorting conductor is separated from the output connector by a distance or no more than 500 microns (e.g., nor more than 100 microns, 50 microns, or 5 microns).

In some embodiments, a method for processing an integrated circuit comprises providing an integrated circuit substrate, a circuit disposed in, on, or over the integrated circuit substrate, an electrical input connector electrically connected to the circuit, an electrical output connector electrically connected to the circuit, and a shorting structure provided in electrical contact with the electrical input connector and in electrical contact with the electrical output connector, and exposing the shorting structure to laser radiation, thereby forming an electrical short between the circuit and the electrical connector.

In some embodiments of the present disclosure, a parallel redundant system comprises a substrate, a wire disposed on, over, or in the substrate, the wire comprising a conductive break, a cut mesh-connected conductive plane disposed on, over, or in the substrate and a conductive path, wherein discontinuities in the cut mesh-connected conductive plane define the conductive path and the conductive path is electrically isolated from the cut mesh-connected conductive plane, and a repair conductor comprising the conductive path, the repair conductor constructed and arranged to conduct electricity from one side of the conductive break to another side of the conductive break, thereby providing electrical continuity to the wire.

The repair conductor can comprise one or more laser welds, one or more shorted integrated circuits, or both. In some embodiments, the cut mesh-connected conductive plane comprises a two-dimensional array of electrically connected conductors, for example conductive lines, traces, or wires.

In some embodiments, the cut mesh-connected conductive plane is a ground plane or a power plane.

In some embodiments, the cut mesh-connected conductive plane is a first cut mesh-connected conductive plane, the conductive path is a first conductive path, and the parallel redundant system comprises a second cut mesh-connected conductive plane disposed on, in, or over the substrate, and a second conductive path, wherein discontinuities in the second cut mesh-connected conductive plane define the second conductive path and the second conductive path is electrically isolated from the second cut mesh-connected conductive plane. In some embodiments, the wire is a first wire having a first conductive break, the repair conductor is a first repair conductor, and the parallel redundant system comprises a second wire comprising a second conductive break, and a second repair conductor comprising the second conductive path, the second repair conductor conducting electricity from one side of the second conductive break to another side of the second conductive break, thereby providing electrical continuity to the second wire. In some embodiments, the first cut mesh-connected conductive plane is a power plane and the second cut mesh-connected conductive plane is a ground plane, and the power plane and the ground plane are electrically isolated (e.g., insulated) from each other.

In some embodiments of the present disclosure, a method for processing an integrated circuit comprises providing a substrate and an integrated circuit disposed on the substrate and heating the integrated circuit to create a force that removes the integrated circuit from the substrate, for example an explosive force or a mechanical force deriving from a thermally induced shock wave. In some embodiments, the step of heating comprises exposing the integrated circuit to laser radiation.

The integrated circuit can be an unpackaged die. The integrated circuit can have at least one dimension that is no more than 200 microns, (e.g., no more than 100 microns, no more than 50 microns, no more than 20 microns, no more than 10 microns, or no more than 5 microns). The integrated circuit can be adhered to the substrate with an adhesive prior to heating the integrated circuit and the step of heating the integrated circuit can heat the adhesive.

In some embodiments, a parallel redundant system comprises a substrate; a first conductor disposed at least partially in a first layer over the substrate and wire routed to the first circuit; a second circuit disposed over the substrate; a second conductor disposed in a second layer over the substrate and electrically connected to the second circuit, the second conductor disposed at least partially over the first conductor; a dielectric layer disposed at least partially between the first layer and the second layer; and a laser weld electrically connecting the first conductor to the second conductor through the dielectric layer.

In some embodiments, the system comprises an interface circuit electrically connected to the first conductor and to the second circuit through the laser weld. In some embodiments, the second circuit is an integrated circuit. In some embodiments, the integrated circuit comprises an unpackaged semiconductor circuit and a broken tether. In some embodiments, the integrated circuit comprises an opening structure. In some embodiments, the integrated circuit comprises a shorting structure.

In some embodiments, the system comprises two or more first conductors disposed in the first layer and two or more second conductors disposed in the second layer each second conductor electrically connected to the second circuit. In some embodiments, the system comprises two or more laser welds, each of the two or more laser welds electrically connecting one of the two or more first conductors to a corresponding one of the two or more second conductors. In some embodiments, one or more of the two or more first conductors is electrically connected to a corresponding one of the two or more second conductors.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1 is a schematic diagram of a system including a circuit according to illustrative embodiments of the present disclosure;

FIG. 2 is a perspective of the system of FIG. 1;

FIGS. 8A and 8B are schematic illustrations of faulty circuits according to illustrative embodiments of the present disclosure;

FIGS. 11A-11G are illustrations of successive structures formed during a method, according to illustrative embodiments of the present disclosure;

FIGS. 17-19 are flow diagrams illustrating methods according to illustrative embodiments of the present disclosure;

Figure 3:
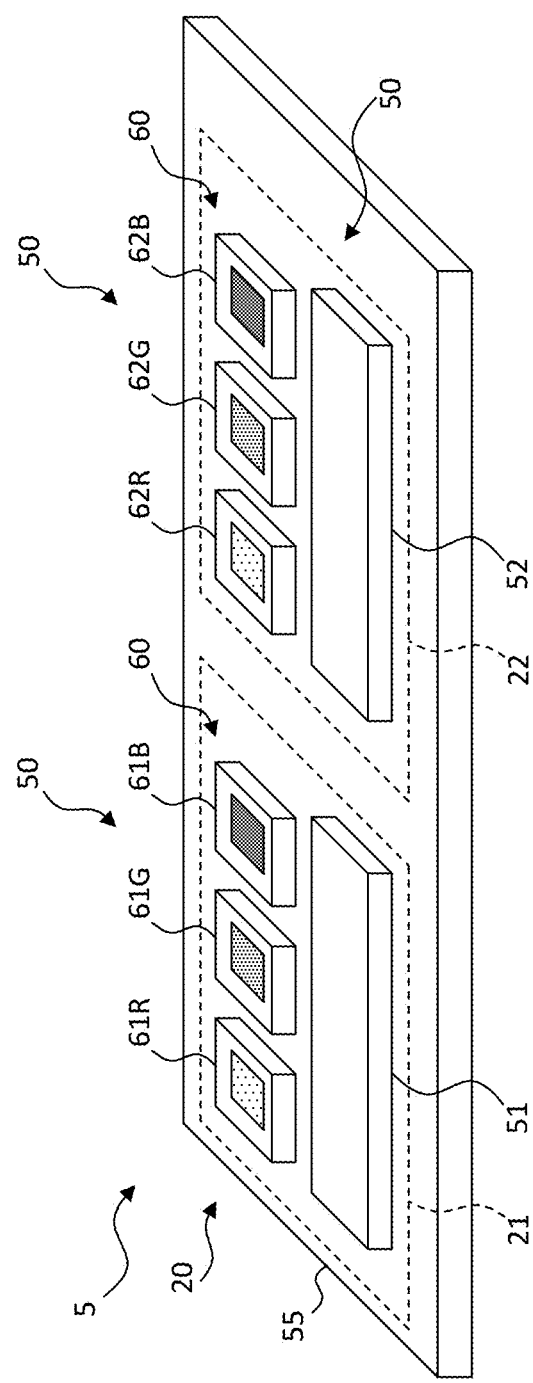
FIG. 3 is a perspective of a system comprising light emitters according to illustrative embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Systems, apparatus, and methods in accordance with certain embodiments provide advantages in robustness, reliability, and manufacturing yields in electronic systems and can overcome integrated circuit faults, and wiring faults in such systems.

Referring to the schematic diagram of FIG. 1 and the corresponding perspective of FIG. 2, a parallel redundant integrated-circuit system 5 according to some embodiments of the present disclosure includes an input connection 30 and an output connection 40. A first active circuit 21 includes one or more first integrated circuits 51 and has an input connected to the input connection 30 and an output connected to the output connection 40. Similarly, a second active circuit 22 includes one or more second integrated circuits 52. The second active circuit 22 is redundant to the first active circuit 21 and also has an input connected to the input connection 30 and an output connected to the output connection 40. Thus, the first and second active circuits 21, 22 have a common input connection 30 and the first and second active circuits 21, 22 have a common output connection 40. The one or more second integrated circuits 52 are separate and distinct from the one or more first integrated circuits 51, for example having separate and independent substrates, having separate electrical contacts, physically separate, are packaged separately in independent packages, or are separate unpackaged dies.

According to some embodiments of the present disclosure, the first and second active circuits 21, 22 are redundant so that they have the same functionality. The first and second active circuits 21, 22 can be similar or identical circuits, can be interchanged with or replace each other, and can be made in first and second integrated circuits 51, 52, respectively that incorporate the same circuits, the same layouts, interconnection arrangements, or that are identical within the limits of an integrated circuit manufacturing process. The first and second active circuits 21, 22 are active circuits 20 that include at least one switching, processing, control, or amplifying element (for example a transistor 25) and are not only resistors, capacitors, or inductors, although such elements can be included in the first and second active circuits 21, 22. The first and second active circuits 21, 22 can also include a common power connection 32 connected to both a power input of the first active circuit 21 and a power input of the second active circuit 22, a ground connection 34 connected to both a ground input of the first active circuit 21 and a ground input of the second active circuit 22, or one or more signal connections connected to both a signal connection of the first active circuit 21 and a signal connection of the second active circuit 22, for example a common clock signal. Alternatively, or in addition, the input or output connections 30, 40 can be signal connections, for example a clock signal connection, a data signal connection, a token connection, an analog signal connection (for example a charge value stored in a capacitor), or a digital signal connection (for example a bit value stored in a latch or flip-flop, such as a D flip-flop). The first and second active circuits 21, 22 can include multiple input or output connections 30, 40. Each input connection 30 is connected in common to corresponding inputs of each of the first and second active circuits 21, 22 and each output connection 40 is connected in common to corresponding outputs of each of the first and second active circuits 21, 22.

In some embodiments of the present disclosure, a data value provided on the input connection 30 is transferred to the output connection 40. For example, the input of each of the first and second active circuits 21, 22 is connected directly to the output so that the input connection 30 is connected directly to the output connection 40 through both the first and second integrated circuits 51, 52. Alternatively, the data value is transferred through a signal-transfer element that is a portion of each of the first and second active circuits 21, 22. The signal-transfer element can be, for example, a flip-flop or latch that propagates the data value in response to a clock signal useful for synchronization. In some embodiments, the signal-transfer element is an amplifier, for example a transistor 25, which amplifies the data value. Such amplification is useful, for example, if the input or output connections 30, 40 are long wires.

The first and second active circuits 21, 22 can be made in one or more first and second integrated circuits 51, 52 having separate, independent, and distinct substrates. For example, the first and second integrated circuits 51, 52 can be chiplets 50, small, unpackaged integrated circuits such as unpackaged dies interconnected with wires connected to contact pads on the chiplets 50. The chiplets 50 can be disposed on an independent substrate, such as a backplane 55. In some embodiments, the chiplets 50 are made in or on a semiconductor wafer and have a semiconductor substrate and the backplane 55 is or includes glass, resin, polymer, plastic, or metal. Semiconductor materials (for example silicon or GaN) and processes for making small integrated circuits are well known in the integrated circuit arts. Likewise, backplane substrates and means for interconnecting integrated circuit elements on the backplane are well known in the printed circuit board arts. The chiplets 50 (e.g., the first and second integrated circuits 51, 52) can be applied to the backplane 55 using micro transfer printing.

As shown in the parallel redundant integrated-circuit system 5 of FIG. 3, the first active circuit 21 can include multiple integrated circuits 50, including first integrated circuit 51 and integrated circuits 61R, 61G, and 61B described further below. Similarly, the second active circuit 22 can include multiple integrated circuits 50, including second integrated circuit 52 and integrated circuits 62R, 62G, and 62B described further below. The multiple integrated circuits 50 can have common substrate materials or a variety of different substrate materials including silicon and GaN. In some embodiments, one of the integrated circuits 50 (for example having a silicon semiconductor substrate) in the active circuit 20 is a control or computing element and another of the integrated circuits 50 (for example having a GaN semiconductor substrate) is a light emitter 60. The light emitter 60 can be an inorganic LED. Thus, in this embodiment, the first active circuit 21 includes a first light emitter 60 and the second active circuit 22 includes a second light emitter 60. The first and second light emitters 60 can emit the same color of light, for example to form a monochrome display. In some embodiments, the first active circuit 21 includes three first light emitters 60: first red-light emitter 61R, first green-light emitter 61G, and first blue-light emitter 61B. The second active circuit 22 includes three second light emitters 60: second red-light emitter 62R, second green-light emitter 62G, and second blue-light emitter 62B, as shown in FIG. 3. The first red-light emitter 61R can be identical to, the same as, or similar to the second red-light emitter 62R, the first green-light emitter 61G can be the identical to, the same as, or similar to the second green-light-emitter 62G, and the first blue-light emitter 61B can be the identical to, the same as, or similar to the second blue-light-emitter 62B. Each of the light emitters 60 can have a separate, independent, and distinct substrate and the different light emitters 60 emitting different colors of light can have different substrate materials, for example different semiconductor materials or differently doped semiconductor materials. The three light emitters 60 of each of the first and second active circuits 21, 22 can form a full-color red, green, and blue pixel in a display.

Figure 4:
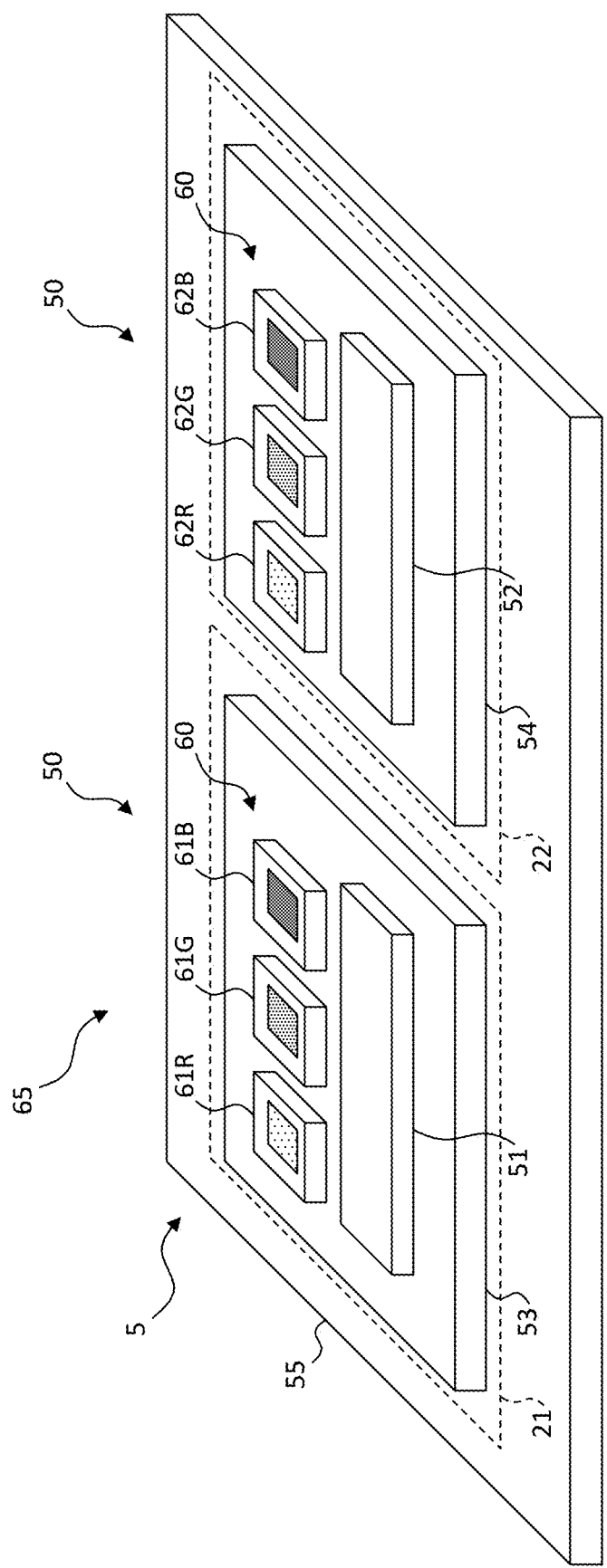
FIG. 4 is a perspective of a display comprising light emitters and a pixel substrate according to illustrative embodiments of the present disclosure.

As shown in FIG. 3, the first active circuit 21 includes a plurality of integrated circuits 50 (first integrated circuit 51, first red-light emitter 61R, first green-light emitter 61G, and first blue-light emitter 61B) and the second active circuit 22 includes a plurality of integrated circuits 50 (second integrated circuit 52, second red-light emitter 62R, second green-light emitter 62G, and second blue-light emitter 62B). Each of these integrated circuits has a substrate separate, independent and distinct from the backplane 55 and is disposed directly on the backplane 55, for example by micro transfer printing. Referring to FIG. 4, the integrated circuits 50 of the first and second active circuits 21, 22 are disposed on first and second pixel substrates 53, 54, respectively, for example by micro transfer printing. The first and second pixel substrates 53, 54, are disposed on the backplane 55 and are smaller than, separate, and distinct from the backplane 55. The first and second pixel substrates 53, 54 can, for example, be similar to the backplane 55 (e.g. made of or including glass, resin, metal, or plastic) but in a much smaller size, for example having an area of no more than 1 square mm (e.g., no more than 500 square microns, no more than 100 square microns, or no more than 50 square microns) and can be only a few microns thick, for example no more than 50 microns (e.g., no more than 20 microns, no more than 10 microns, or no more than 5 microns) thick.

In some methods of the present disclosure the first and second pixel substrates 53, 54, are disposed on the backplane 55 by micro transfer printing using compound micro assembly structures and methods, for example as described in U.S. Patent Application Ser. No. 62/055,472 filed Sep. 25, 2014, entitled Compound Micro-Assembly Strategies and Devices, the contents of which are hereby incorporated by reference in its entirety. However, since the first and second pixel substrates 53, 54, are larger than the individual integrated circuits 50 in each of the first and second active circuits 21, 22, in some methods of the present disclosure, the first and second pixel substrates 53, 54, are disposed on the backplane 55 using pick-and-place methods found in the printed-circuit board industry, for example using vacuum grippers. The integrated circuits 50 in the first and second active circuits 21, 22 can be interconnected using photolithographic methods and materials or printed circuit board methods and materials. The interconnections are shown in FIGS. 1 and 2, but for clarity are omitted from FIGS. 3 and 4.

In useful embodiments the display substrate 55 includes material, for example glass or plastic, different from a material in an integrated-circuit substrate, for example a semiconductor material such as silicon or GaN. The light emitters 60 can be formed separately on separate semiconductor substrates, assembled onto the first or second pixel substrates 53, 54, and then the assembled unit is located on the surface of the backplane 55. This arrangement has the advantage that the active circuits 20 can be separately tested on the first or second pixel substrate 53, 54 and the first or second pixel substrate 53, 54 accepted, repaired, or discarded before the first or second pixel substrate 53, 54 is located on the backplane 55, thus improving yields and reducing costs.

Figure 5:
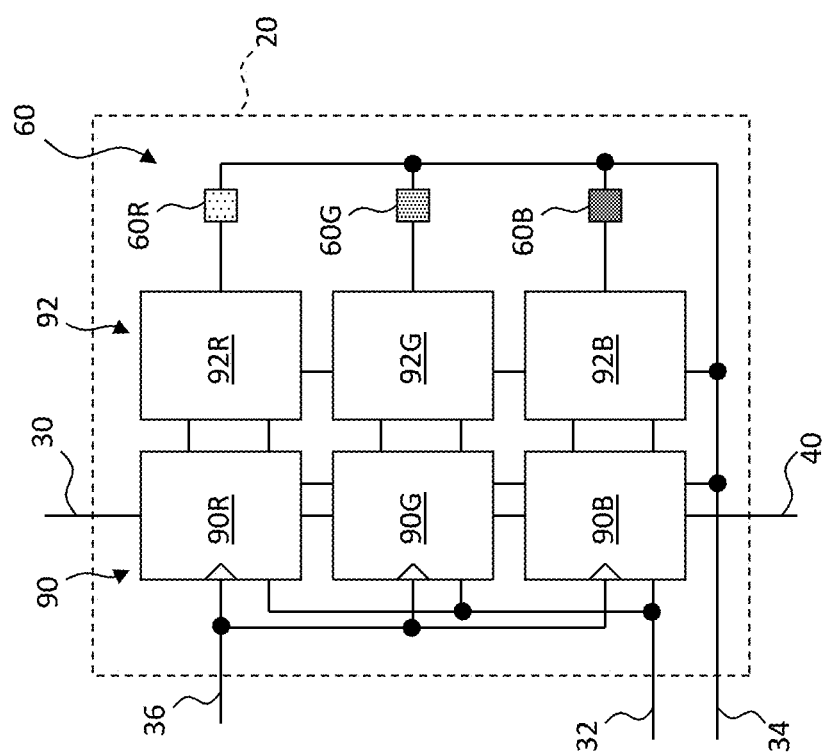
FIG. 5 is a schematic diagram of a circuit according to illustrative embodiments of the present disclosure.

Referring to FIG. 5, in some embodiments of the present disclosure, an active circuit 20 (e.g., first active circuit 21 or second active circuit 22) includes first, second, and third storage elements 90 (e.g., red storage element 90R, green storage element 90G, and blue storage elements 90B) for storing three data values corresponding to a desired light output from each of the red-light emitter 60R, the green-light emitter 60G, and the blue-light emitter 60B. The differently colored light emitters 60 can be sub-pixels in a pixel. The data values can be, for example, a single digital bit stored in a latch or a flip-flop (such as a D flip-flop as shown) or a multi-bit value stored in a plurality of latches or flip-flops, such as a register or memory. Alternatively, the storage elements 90 can store analog values, for example in a capacitor (not shown). A red driver circuit 92R drives the red-light emitter 60R with the data value stored in the red storage element 90R, a green driver circuit 92G drives the green-light emitter 60G with the data value stored in the green storage element 90G, and a blue driver circuit 92B drives the blue-light emitter 60B with the data value stored in the blue storage element 90B.

In some embodiments, the driver circuits 92 drive the light emitters 60 with a current-controlled drive signal. The current-controlled drive signal can convert an analog value (e.g., a charge stored in a capacitor storage element 90) to a current drive signal or, as shown, the current-controlled drive signal can convert a digital bit value (e.g., a voltage stored in a flip-flop or latch storage element 90) to a current drive signal, thus forming a bit-to-current convertor. Current-drive circuits, such as current replicators, are known in the art and can be controlled with a pulse-width modulation scheme whose pulse width is determined by the digital bit value. A separate driver circuit 92 can be provided for each light emitter 60, as shown, or a common driver circuit 92, or a driver circuit 92 with some common components can be used to drive the light emitters 60 in response to the data values stored in the storage elements 90. Power connection 32, ground connection 34, and clock signal connection 36 control the active circuit 20. Data values are transferred through the storage elements 90 of the active circuit 20 from the input connection 30 to the output connection 40 by clocking the flip-flops to form a serial shift register.

Thus, in some embodiments, the first active circuit 21 includes a first red-light emitter 61R that emits red light, a first green-light emitter 61G that emits green light, and a first blue-light emitter 61B that emits blue light. A first driver circuit 92 comprises a first red driver circuit 92R driving the first red-light emitter 61R, a first green driver circuit 92G driving the first green-light emitter 61G, and a first blue driver circuit 92B driving the first blue-light emitter 61B.

The second active circuit 22 includes a second red-light emitter 62R that emits red light, a second green-light emitter 62G that emits green light, and a second blue-light emitter 62B that emits blue light. A second driver circuit 92 comprises a second red driver circuit 92R driving the second red-light emitter 62R, a second green driver circuit 92G the second green-light emitter 62G, and a second blue driver circuit 92B driving the second blue-light emitter 62B. In some embodiments, the first driver circuit 92 comprises a first bit-to-current convertor and the second driver circuit 92 comprises a second bit-to-current convertor. The first active circuit 21 comprises a first storage element 90 and the second active circuit 22 comprises a second storage element 90.

Although the present disclosure has been illustrated, for example, with two active circuits 20 (first active circuit 21 and second active circuit 22) that are mutually redundant, in a some embodiments (not shown), a third active circuit includes one or more third integrated circuits 50. The third active circuit is redundant to the first and second active circuits 21, 22 and has an input connected to the input connection and an output connected to the output connection. The third integrated circuits are separate and distinct from the first and second integrated circuits 51, 52. Providing a third active circuit further reduces the likelihood of a fault rendering a parallel redundant integrated-circuit system 5 unusable.

Figure 6:
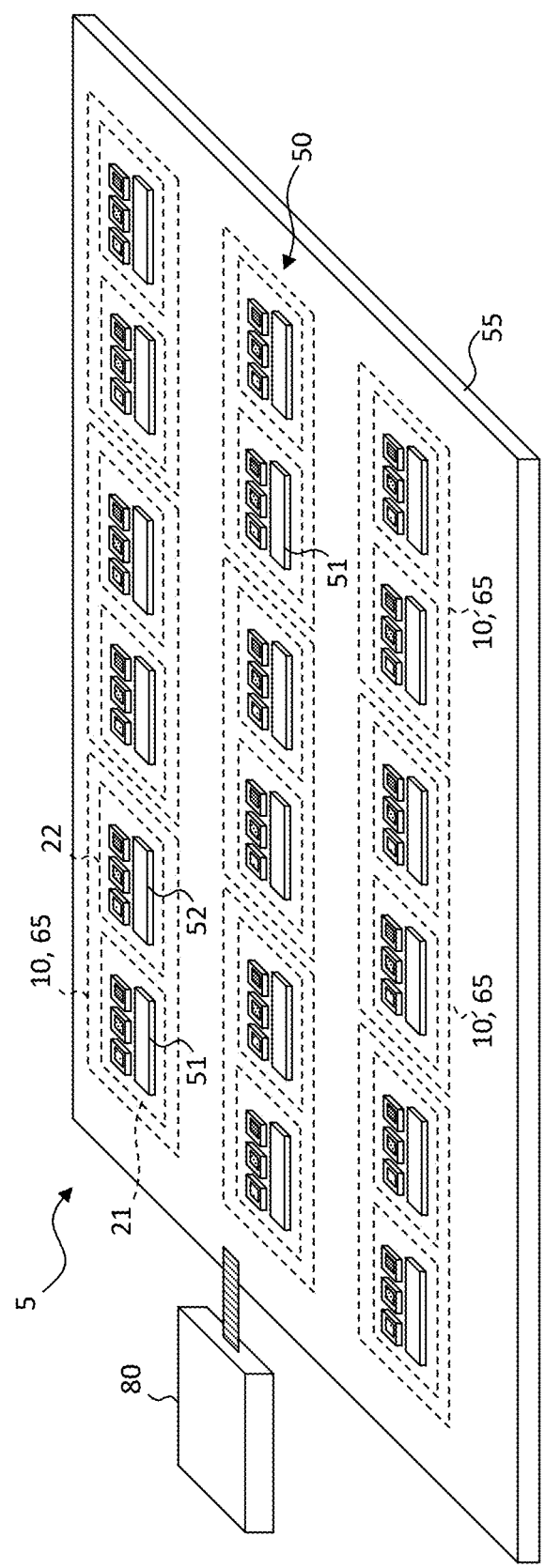
FIG. 6 is a perspective of a display according to illustrative embodiments of the present disclosure.
Figure 7:
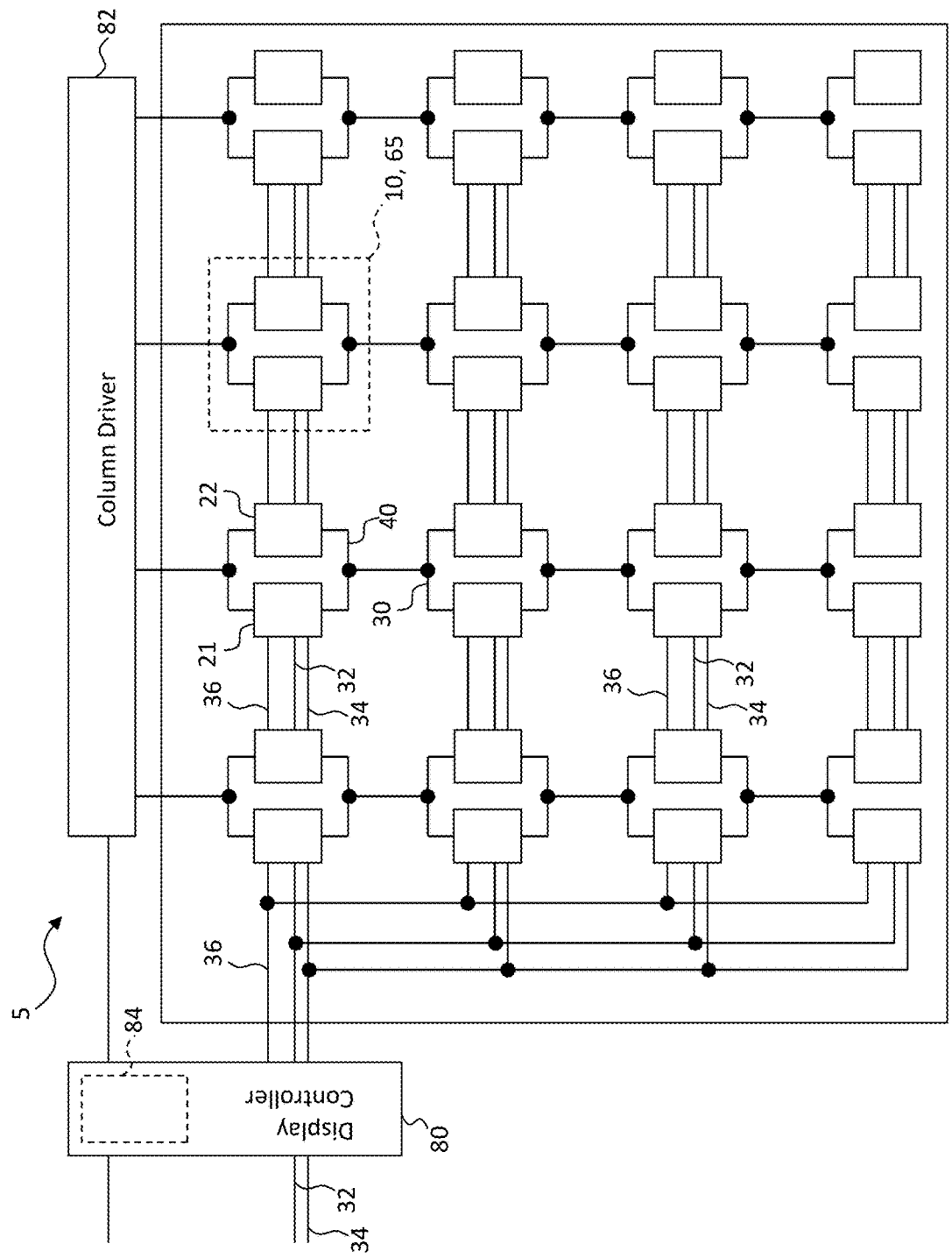
FIG. 7 is a schematic diagram of a display according to illustrative embodiments of the present disclosure.

Referring next to the perspective of FIG. 6 and corresponding schematic diagram of FIG. 7, the input connection 30, the output connection 40, the first active circuit 21, and the second active circuit 22 form a component group 10 that, in this embodiment, is also a redundant full-color pixel 65 including red, green and blue colors. (In some embodiments, the redundant full-color pixels 65 can include additional colors and the first and second active circuits 21, 22 include additional light emitters 60 emitting light of additional colors, such as yellow or cyan.) In some embodiments, a parallel redundant integrated-circuit system 5 includes a plurality of component groups 10. Each component group 10 includes a redundant pair of first and second active circuits 21, 22, each with one or more, for example three, light emitters 60 (FIG. 3), has redundant first and second integrated circuits 51, 52, and forms the redundant full-color pixel 65. Thus, in some embodiments, the first and second active circuits 21, 22 of each component group 10 of the plurality of component groups 10 each comprise one or more light emitters 60.

A parallel redundant integrated-circuit system 5 can include a controller 80 connected to the plurality of component groups 10 for providing control signals to the component groups 10. The component groups 10 can be arranged in a regular array to form a display and the controller 80 can be a display controller 80 that provides signals to the input connections 30 of the component groups 10 to drive the light emitters 60 of the component groups 10. In this arrangement, the plurality of component groups 10 includes a first component group 10 and a second component group 10 and the output connection 40 of the first component group 10 is connected to the input connection 30 of the second component group 10, for example to form a column (or row, not shown) of serially connected component groups 10 capable of transferring data values along the column.

The display controller 80 can include a memory 84 for storing calibration and display pixel values for the display that are communicated to a column driver 82. The column driver 82 passes the display pixel values down the columns of component groups 10 to display an image. Because the display pixel values, in this embodiment, are shifted down the column of component groups 10, for example with storage elements 90 (FIG. 5) row select control lines for the display are not necessary.

According to the present disclosure, manufacturing processes are imperfect and can result in faulty circuits or circuit elements. If both the first and second active circuits 21, 22 in a component group 10 are operating normally, both will emit light according to their input connections 30. If one of the first and second active circuits 21, 22 fails to emit light, either because of a faulty LED or faulty circuitry, the other of the first and second active circuits 21, 22, will emit light according to its input connections 30. Thus, if any of the light emitters 60 or an active circuit 20 fails, the redundant active circuit 20 can continue to operate.

As shown in FIGS. 8A and 8B, a variety of different faults are possible. Referring to FIG. 8A, a single LED, a single storage element 90, or a driver circuit 92 is faulty, for example having an electrical short or open as indicated with the X marks. This fault results in the single LED (e.g., the green-light emitter 60G) failing to operate properly although the remaining LEDs (e.g., the red-light and blue-light emitters 60R, 60B) do. In this example, both redundant red-light emitters 60R and blue-light emitters 60B in the component group 10 will operate normally although only one green-light emitter 60G will operate. In contrast, referring to FIG. 8B, a signal connection such as the input connection 30, the clock signal connection 36, the power connection 32, or the ground connection 34 is faulty as indicated with the X marks. In this example all three of the 60R, the green-light emitter 60G, and the blue-light emitter 60B will fail so that only red-light emitter 60R, the green-light emitter 60G, and blue-light emitter 60B of the redundant pair of first and second active circuits 21, 22 in the component group 10 will emit light.

Figure 9:
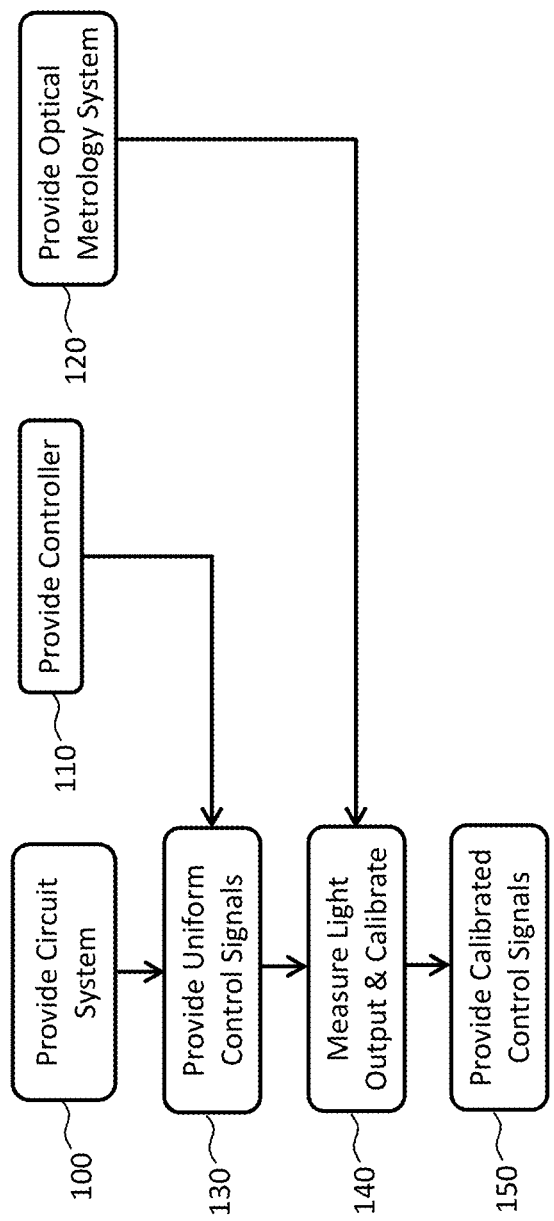
FIG. 9 is a flow chart illustrating a method according to illustrative embodiments of the present disclosure.

Because the first and second active circuits 21, 22 of a component group 10 with a faulty storage element 90, drive circuit 92, or light emitter 60 will emit less light than a normally operating component group 10 when driven with a common signal, a calibration is performed to enable uniform light output from the plurality of component groups 10 when the plurality of component groups 10 are controlled with a common signal. Referring to the method illustrated by the flow diagram of FIG. 9, in some embodiments, the circuit system is provided in step 100, the controller 80 is provided in step 110, and an optical metrology system, for example a light measurement and calibration device including one or more light sensors responsive to different colors of light, is provided in step 120. The circuit system can include a plurality of component groups 10 in a display as illustrated in FIGS. 6 and 7.

Although not specifically illustrated in the Figures or as a method step, the provision of the circuit system can include forming conductive wires on the backplane 55 using photolithographic and display substrate processing techniques, for example photolithographic processes employing metal or metal oxide deposition using evaporation or sputtering, curable resin coatings (e.g. SU8), positive or negative photoresist coating, radiation (e.g. ultraviolet radiation) exposure through a patterned mask, and etching methods to form patterned metal structures, vias, insulating layers, and electrical interconnections. Inkjet and screen-printing deposition processes and materials can be used to form patterned conductors or other electrical elements. The electrical interconnections, or wires, can be fine interconnections, for example having a width of less than 50 microns, less than 20 microns, less than 10 microns, less than five microns, less than two microns, or less than one micron. Such fine interconnections are useful for interconnecting chiplets 50, for example as bare dies with contact pads and used with the first or second pixel substrates 53, 54. Alternatively, wires can include one or more crude lithography interconnections having a width from 2 μm to 2 mm, wherein each crude lithography interconnection electrically connects the first or second pixel substrates 53, 54 to the backplane 55.

The redundant light emitters 60 are electrically connected to one or more electrically conductive wires that electrically connect the redundant light emitters 60 and the active circuits 20 to conduct power, a ground reference voltage, or signals for controlling the light emitters 60. In some embodiments, the conductive wires are connected to a display controller 80 that is external to the display substrate backplane 55. In an alternative embodiment, not shown, the display controller 80 is located on the display substrate backplane 55 outside the display substrate area. The display controller 80 controls the parallel redundant integrated-circuit system 5 by, for example, providing power, a ground reference signal, and control signals.

In some embodiments, the light emitters 60 (e.g. micro-LEDs) are transfer printed to the first or second pixel substrates 53, 54 or the backplane 55 in one or more transfers. For a discussion of micro-transfer printing techniques see, U.S. Pat. Nos. 8,722,458, 7,622,367 and 8,506,867, the contents of each of which is hereby incorporated by reference in their entirety. The transferred light emitters 60 are then interconnected, for example with conductive wires and optionally including connection pads and other electrical connection structures, to enable the display controller 80 to electrically interact with the light emitters 60 to emit light in a parallel redundant integrated-circuit system 5. In some embodiments, the transfer of the light emitters 60 is performed before or after all of the conductive wires are in place. Thus, in embodiments the construction of the conductive wires can be performed before the light emitters 60 are printed or after the light emitters 60 are printed or both. In some embodiments, the display controller 80 is externally located (for example on a separate printed circuit board substrate) and electrically connected to the conductive wires using connectors, ribbon cables, or the like. Alternatively, the display controller 80 is affixed to the backplane 55 outside the display substrate area and electrically connected to the conductive wires using wires and buses, for example using surface mount and soldering technology.

The controller 80, for example a display controller 80, provides uniform control signals for the plurality of display component groups 10 in step 130. However, because of manufacturing or operating faults, at least one of the component groups 10 emits less light than another component group 10. This difference in emitted light is measured by the optical metrology system and a calibration value computed for one or more component groups 10 in step 140, for example by determining that the light emitted by a first component group 10 is less than the light emitted by a second component group 10. The calibration values can be stored in the display controller 80 memory 84. For example, a first calibration value for the first component group 10 is stored such that the light emitted light by the first component group 10 is substantially the same as the light emitted by the second component group 10 when the control signal is provided in common for a plurality of component groups 10 including a faulty component group 10. By substantially the same is meant that the component groups 10 emit the same amount of light within the variability of the normally operating LED and circuit components.

The display controller 80 then provides calibrated control signals to the array of component groups 10 in step 150, for example by using a lookup table to convert an input control signal to a calibrated output control signal. The display can then operate normally by receiving an external image signal, converting it to a calibrated image signal using the controller 80 and the calibration values stored in the memory 84, and then providing the calibrated image signal to the component groups 10 through the column driver 82. (As is well understood by those knowledgeable in the art, rows and columns are arbitrary designations that can be interchanged.) For example, in the case of a fault shown in FIG. 8B in which all three light emitters fail, the calibrated output control signal for the faulty component group 10 can specify a driving value for each of the three red-, green-, and blue-light emitters 60R, 60G, 60B that is two times greater than the driving value for a normally operating component group 10. Thus, the remaining functional active circuit 20 will emit twice as much light so that the same amount of light is emitted from the one functional active circuit 20 in the faulty component group 10 as is emitted from both of the active circuits 20 of the normally operating component group 10. In the case of a fault shown in FIG. 8A in which only one of the three light emitters fails, the calibrated output control signal for the faulty component group 10 can specify a driving value for the faulty red-, green-, or blue-light emitter 60R, 60G, 60B that is two times greater than the driving value for the corresponding red-, green, or blue-light emitter 60R, 60G, 60B of a normally operating component group 10. Thus, the light emitter 60 of the fully functional active circuit 20 corresponding to the faulty light emitter of the faulty active circuit 20 will emit twice as much light so that the same amount of light is emitted from the one functional active circuit 20 in the faulty component group 10 as is emitted from both of the active circuits 20 of the normally operating component group 10. Thus, in this embodiment, a first calibration value for a first component group 10 is a factor of two of a second calibration value for a second component group 10. In the example of FIG. 8A, the green-light emitter 60G of the normally operating active circuit 20 will be driven to emit twice as much light to compensate for the faulty green-light emitter 60G of the faulty component group 10. The red- and blue-light emitters 60R and 60B of both active circuits 20 will emit the usual amount of light. In this embodiment, a first calibration value for a light emitter in the first component group 10 is a factor of two of a second calibration value for a corresponding light emitter in the second component group 10. In some embodiments, all of the light emitters 60 in a component group 10 are spatially located close enough together that they cannot be resolved by the human visual system at a designed viewing distance.

Referring back to FIGS. 6 and 7, the last row of component groups 10 does not require an output connection 40 to pass along data since there are no component groups 10 below it in the display. Furthermore, in an alternative design, data values are not sequentially shifted through the active circuits 20 of the component groups 10 but are provided in parallel to all of the component groups 10 and row control signals, either internal or external to the display, select the row of component groups 10 that store the data values, for example by controlling a clock signal to shift the data values into the storage elements 90 in the row. In such a design, no output connections 40 are needed.

Therefore, in some embodiments, a parallel redundant integrated-circuit system 5 includes an input connection 30 and a first active circuit 21 comprising one or more first integrated circuits 51. The first active circuit 21 has an input connected to the input connection 30 and includes at least one light emitter 60. A second active circuit 22 comprises one or more second integrated circuits 52. The second active circuit 22 is redundant to the first active circuit 21, has an input that is also connected to the same input connection 30, and includes at least one light emitter 60. The second integrated circuits 52 are separate and distinct from the first integrated circuits 51. In one embodiment, the at least one light emitter 60 of the first active circuit 21 comprises a first red-light emitter 61R that emits red light, a first green-light emitter 61G that emits green light, and a first blue-light emitter 61B that emits blue light. Similarly, the at least one light emitter 60 of the second active circuit 22 comprises a second red-light emitter 62R that emits red light, a second green-light emitter 62G that emits green light, and a second blue-light emitter 62B that emits blue light. Light emitters 60 can be arranged in an array so that a parallel redundant integrated-circuit system 5 is a display.

Figure 10:
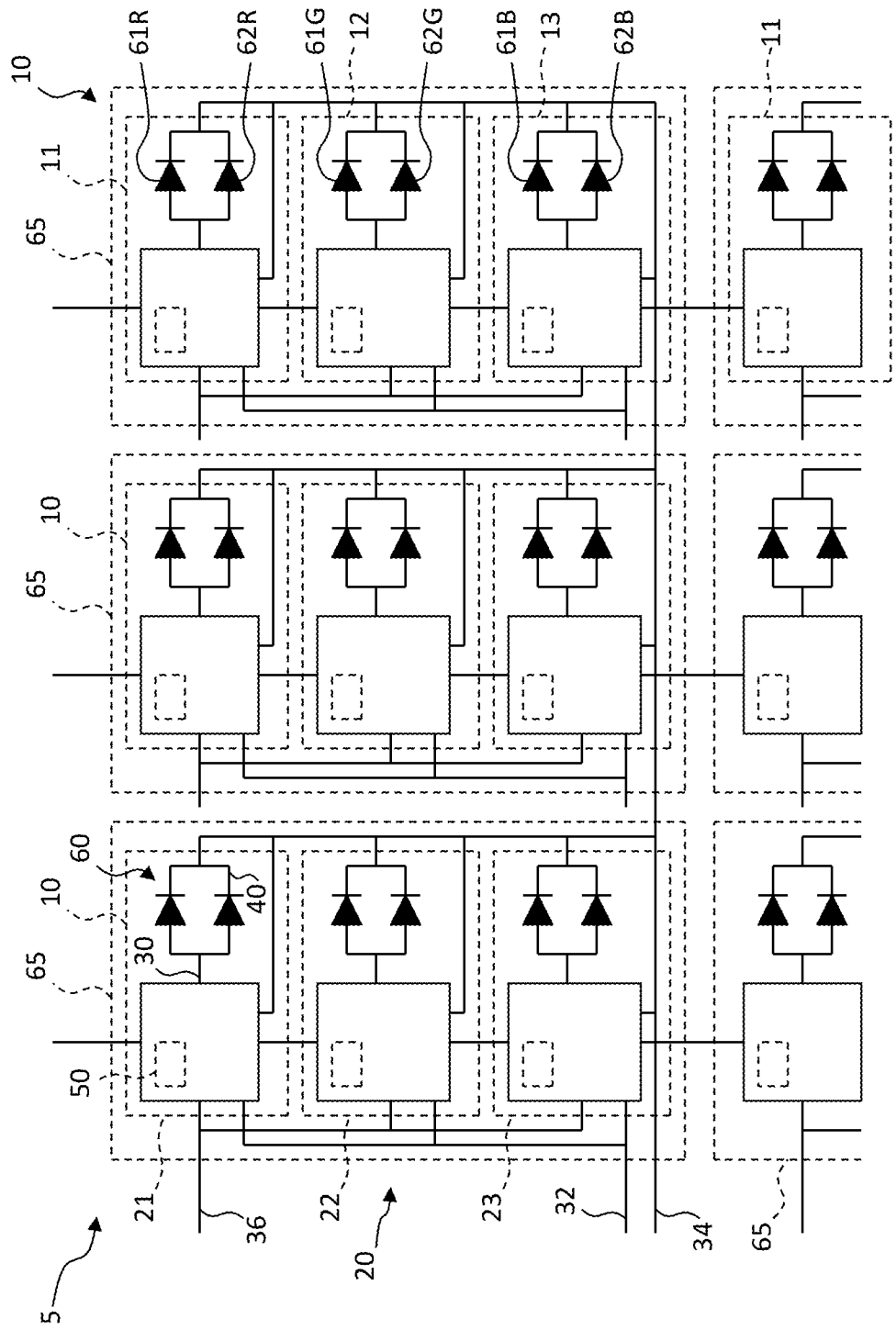
FIG. 10 is a schematic diagram of a system according to illustrative embodiments of the present disclosure.

Referring to FIG. 3, each active circuit 20 includes a triplet of red-light, green-light, and blue-light emitters 60 and redundant pairs of active circuits 20 are provided in each component group 10 to form a redundant full-color pixel 65. Each component group 10 corresponds to a redundant full-color pixel 65. Referring to FIG. 10, in some embodiments, each active circuit 20 includes two or more redundant light emitters 60 connected in parallel with common input connections 30 and output connections 40 to form a component group 10 and a triplet of red-light, green-light, and blue-light emitting component groups 10 with first, second, and third active circuits 21, 22, 23 forms a redundant full-color pixel 65.

In this alternative embodiment, a parallel redundant integrated-circuit system 5 is a display including an array of component groups 10. Each component group 10 includes one or more integrated circuits 50 and two or more redundant light emitters 60 having a common input connection 30 and a common output connection 40. The two or more redundant light emitters 60 are separate and distinct from each other, for example having separate and independent substrates of the same or different substrate materials. The one or more integrated circuits 50 respond to control signals to drive the light emitters 60 in parallel to emit light. As noted with respect to FIG. 4, in this embodiment, each active circuit 20 (corresponding to a component group 10) can be provided on a separate and distinct pixel substrate (e.g., pixel substrate 53 or 54).

Referring to FIG. 10, the parallel redundant integrated-circuit system 5 forms a display that includes one or more red-light component groups 11, green-light component groups 12, and blue-light component groups 13. The two or more redundant light emitters 60 in each red-light component group 11 comprise two or more redundant first and second red-light emitters 61R, 62R that emit red light and have a common input connection 30 and a common output connection 40. The two or more redundant light emitters 60 in each green-light component group 12 comprise two or more redundant first and second green-light emitters 61G, 62G that emit green light and have a common input connection 30 and a common output connection 40. The two or more redundant light emitters 60 in each blue-light component group 13 comprise two or more redundant first and second blue-light emitters 61B, 62B that emit blue light and have a common input connection 30 and a common output connection 40. The two or more redundant light emitters 60 in each component group 10 are functionally the same (within the variability of a manufacturing process), are driven together with the same signals, and are calibrated in the same step and with the same calibration value. The two or more redundant light emitters 60 in each component group 10 can be identical components within the variability of a manufacturing process.

In some embodiments, an array of component groups 10 (e.g., as in FIG. 6 or 10) can include 40,000, 62,500, 100,000, 500,000, one million, two million, three million, six million or more component groups 10, for example for a quarter VGA, VGA, or HD display having various resolutions. In some embodiments, the light emitters 60 can be considered integrated circuits 50, since they are formed in a substrate using integrated-circuit processes.

According to various embodiments of the present disclosure, a parallel redundant integrated-circuit system 5, for example as used in a display, can include a display substrate on which the array of component groups 10 are disposed. For example, the backplane 55 can be a display substrate 55, as shown in FIGS. 2-4, and 6. The display substrate 55 usefully has two opposing smooth sides suitable for material deposition, photolithographic processing, or micro-transfer printing of micro-LEDs. The display substrate 55 can have a size of a conventional display, for example a rectangle with a diagonal of a few centimeters to one or more meters. Such substrates are commercially available. The display substrate 55 can include polymer, plastic, resin, polyimide, PEN, PET, metal, metal foil, glass, a semiconductor, or sapphire and have a transparency of at least 50% (e.g., at least 80%, at least 90%, or at least 95%) for visible light. In some embodiments of the present disclosure, the light emitters 60 emit light through the display substrate 55. In some embodiments, the light emitters 60 emit light in a direction opposite the display substrate 55. The display substrate 55 can have a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm). According to some embodiments of the present disclosure, the display substrate 55 can include layers formed on an underlying structure or substrate, for example a rigid or flexible glass or plastic substrate.

In some embodiments, the display substrate 55 can have a single, connected, contiguous display substrate area that includes the light emitters 60 and the light emitters 60 each have a light-emissive area. The combined light-emissive areas of the plurality of light emitters 60 is less than or equal to one-quarter of the contiguous display substrate area. In some embodiments, the combined light-emissive areas of the plurality of light emitters 60 is less than or equal to one eighth, one tenth, one twentieth, one fiftieth, one hundredth, one five-hundredth, one thousandth, one two-thousandth, or one ten-thousandth of the contiguous display substrate area. The light-emissive area of the light emitters 60 can be only a portion of the light emitter 60. In a typical light-emitting diode, for example, not all of the semiconductor material in the light-emitting diode necessarily emits light. Therefore, in some embodiments, the light emitters 60 occupy less than one quarter of the display substrate area.

In some embodiments, the light emitters 60 are micro-light-emitting diodes (micro-LEDs), for example having light-emissive areas of less than 10, 20, 50, or 100 square microns. In some embodiments, light emitters 60 have physical dimensions that are less than 100 µm, for example having at least one of a width from 2 to 50 µm (e.g., 2 to 5

μm, 5 to 10 μm, 10 to 20 μm, or 20 to 50 μm), a length from 2 to 50 μm (e.g., 2 to 5 μm, 5 to 10 μm, 10 to 20 μm, or 20 to 50 μm), and a height from 2 to 50 μm (e.g., 2 to 5 μm, 5 to 10 μm, 10 to 20 μm, or 20 to 50 μm). Light emitters 60 can have a size of one square micron to 500 square microns. Such micro-LEDs have the advantage of a small light-emissive area compared to their brightness as well as color purity providing highly saturated display colors and a substantially Lambertian emission providing a wide viewing angle.

According to various embodiments, a parallel redundant integrated-circuit system 5, for example as used in a display according to some embodiments, includes a variety of designs having a variety of resolutions, light emitter 60 sizes, and displays having a range of display substrate areas. For example, display substrate areas ranging from 1 cm by 1 cm to 1 m by 1 m in size are contemplated. In general, larger light emitters 60 are most useful, but are not limited to, larger display substrate areas. The resolution of light emitters 60 over a display substrate can also vary, for example from 50 light emitters 60 per inch to hundreds of light emitters 60 per inch, or even thousands of light emitters 60 per inch. For example, a three-color display can have one thousand 10 μm×10 μm light emitters 60 per inch (on a 25-micron pitch). Thus, displays according to some embodiments can be either low-resolution or very high-resolution displays. An approximately one-inch 128 by 128 pixel display having 3.5 micron by 10-micron emitters has been constructed and successfully operated without redundant emitters as described in U.S. Pat. No. 9,520,537 filed Jun. 18, 2015, entitled Micro Assembled Micro LED Displays and Lighting Elements, the contents of which are hereby incorporated by reference in its entirety.

As shown in FIGS. 6 and 7, the redundant full-color pixels 65 form a regular array on the display substrate 55. Alternatively, at least some of the redundant full-color pixels 65 have an irregular arrangement on the display substrate 55. The active circuits 20 can be pixel controllers or light-emitter controllers electrically connected to the light emitters 60 (for example the red-light emitter 61R or 62R, the green-light emitter 61G or 62G, or the blue-light emitter 61B or 62B) to control the light output of the one or more light emitters 60, for example in response to control signals from the display controller 80 through conductive wires formed on the display substrate 55.

Referring to the cross section of FIG. 11G (a system made, for example, using methods that produce intermediate structures shown in FIG. 11A-11F, described in detail below) and according to some embodiments of the present disclosure, parallel redundant integrated-circuit system 5 comprises a substrate 55 and a first circuit 21 disposed over or on substrate 55. First circuit 21 can be a first active circuit 21 or a first passive circuit. A first conductor 210 is disposed at least partially in a first layer 220 over, in, or on substrate 55 and is wire routed to first circuit 21. First conductor 210 can be, for example, any one of input connection 30, power connection 32, ground connection 34, signal connection 36, and output connection 40 and can be a wire, trace, or other electrical conductor formed on, in, or over substrate 55. A second circuit 22 is disposed over or on substrate 55. Second circuit 22 is redundant to first circuit 21 and can be substantially identical in function, operation, construction, or packaging to first circuit 21, that is, within manufacturing tolerances. Second circuit 22 can be a second active circuit 22 or a second passive circuit. First and second circuits 21 and 22 can comprise the same input, output, power, and ground signals and can operate substantially identically within manufacturing tolerances in response to such signals. A second conductor 212 is disposed in a second layer 222 over or on substrate 55 and is electrically connected to second circuit 22. Second conductor 212 is disposed at least partially over, under, above, below, or beneath first conductor 210, for example in a direction orthogonal to a surface of substrate 55. (Under and over, above and below are understood herein to be arbitrary orientations.) Second conductor 212 can be, for example, any one of input connection 30, power connection 32, ground connection 34, signal connection 36, and output connection 40 and can be a wire, trace, or other electrical conductor formed on, in, or over substrate 55. When electrically connected to first conductor 210, second conductor 212 can carry a same signal as first conductor 210. A dielectric layer 230 is disposed at least partially between first layer 220 and second layer 222. Dielectric layer 230 can electrically insulate first conductor 210 from second conductor 212 (e.g., prior to formation of a laser weld 250). A laser weld 250 electrically connects first conductor 210 to second conductor 212, for example where second conductor 212 overlaps first conductor 210 in a direction orthogonal to a surface of substrate 55.

First and second active circuits 21, 22 can be insulated by dielectric structures 260 and electrically connected by electrodes 270 to first and second conductors 210, 212. Dielectric structures 260 and electrodes 270 can be formed photolithographically, for example. A wire-routed conductor, such as first conductor 210, is disposed on, over, or in a substrate surface or layer and extends from one location on, over, or in the substrate surface to another location. The wire-routed conductor can be continuous, e.g., electrically continuous, or discontinuous, e.g., comprising gaps such as openings that prevent electrical conduction from the one location to the other location. Such a gap or opening can be formed in a continuous conductor (e.g., first conductor 210), for example, by cutting the continuous conductor so that the conductor becomes discontinuous.

A laser weld 250 is an electrical interlayer connection formed over or on a substrate that electrically connects two otherwise electrically separate electrical conductors. For example, a laser weld 250 can be an electrical interlayer connection formed over or on a substrate that electrically connects two conductive layers otherwise separated by an insulating layer or layer (e.g., a dielectric layer 230). For example, a laser weld 250 can be an electrical interlayer connection formed on a substrate that electrically connects two conductors (e.g., wires or traces) in two separate layers, for example first conductor 210 in first layer 220 and second conductor 212 in second layer 222, that can be separated by an insulating layer, for example dielectric layer 230 disposed over substrate 55. Laser welds 250 can be formed by locally heating material (e.g., a conductor or insulator disposed on, over, or in a substrate) to vaporize the locally heated material, forming a shock wave that forms an opening (e.g., a pit) around the removed material and melts and fuses any metal near the vaporized material. If the vaporized material is located near or in two metal layers separated by a dielectric layer (for example first conductor 210 in first layer 220, second conductor 212 in second layer 222, and dielectric layer 230), a pit is formed in the dielectric layer and the metal layers are fused on the edges of the pit to form an electrical connection between the metal layers.

Figure 12:
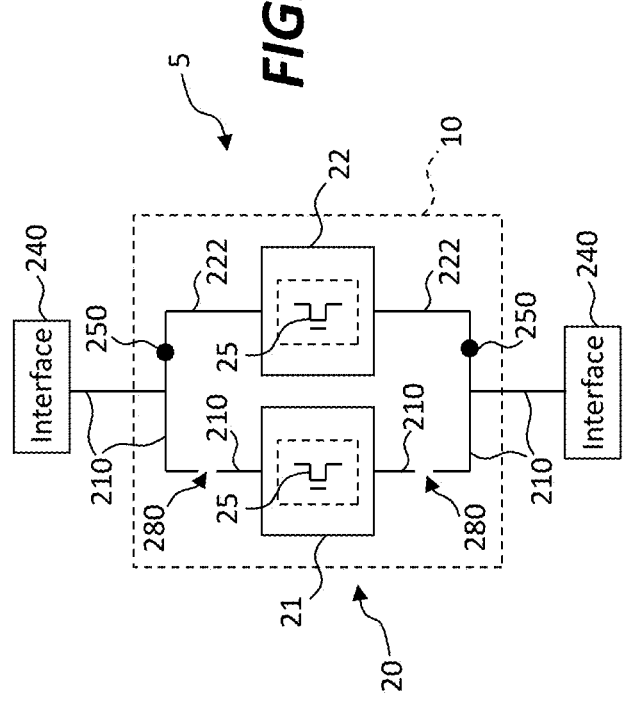
FIG. 12 is a schematic diagram corresponding to FIG. 1 according to illustrative embodiments of the present disclosure.
Figure 13:
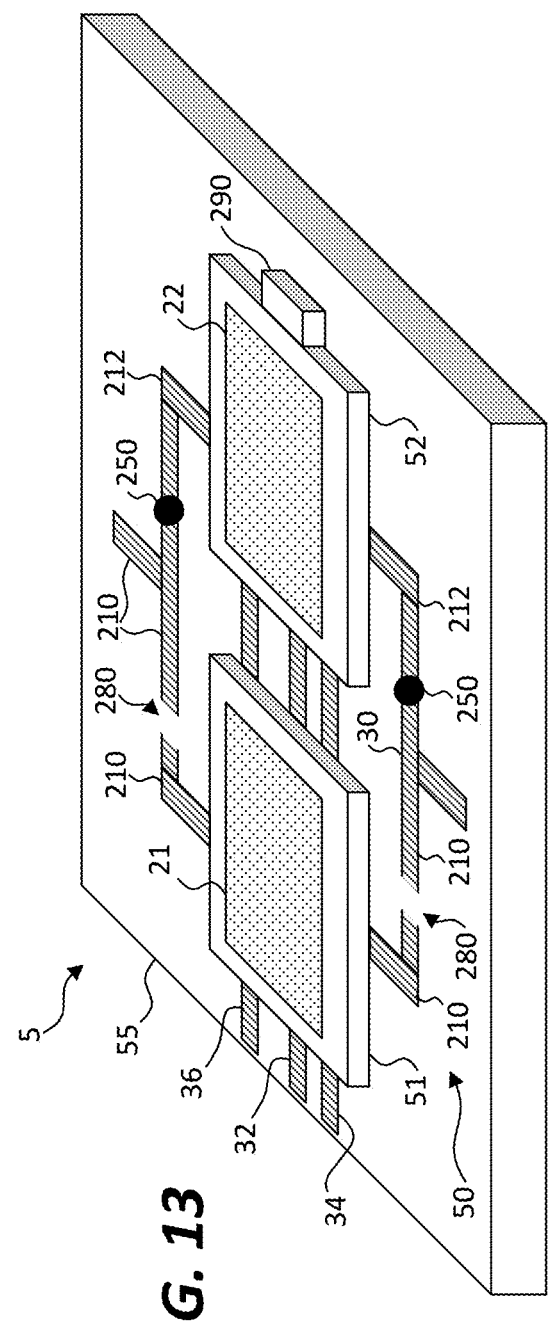
FIG. 13 is a perspective view of an illustrative system in accordance with FIG. 12, according to illustrative embodiments of the present disclosure.

Referring to FIG. 12, according to some embodiments, parallel redundant system 5 comprises an interface circuit 240 electrically connected to first conductor 210. FIG. 13, a perspective view in accordance with FIG. 12, is similar to FIG. 1 (excluding the presence of interface circuit 240).

Laser welds 250, with first and second conductors 210, 212, respectively, are indicated in FIG. 13. Interface circuit 240 can be a circuit (e.g., a semiconductor integrated circuit) that provides an electrical signal to first or second circuits 21, 22 (e.g., is a controller). As used herein, interface circuit 240 can also respond to signals, for example from first or second circuits 21, 22, and can be an output device, e.g., an LED.

Figure 14:
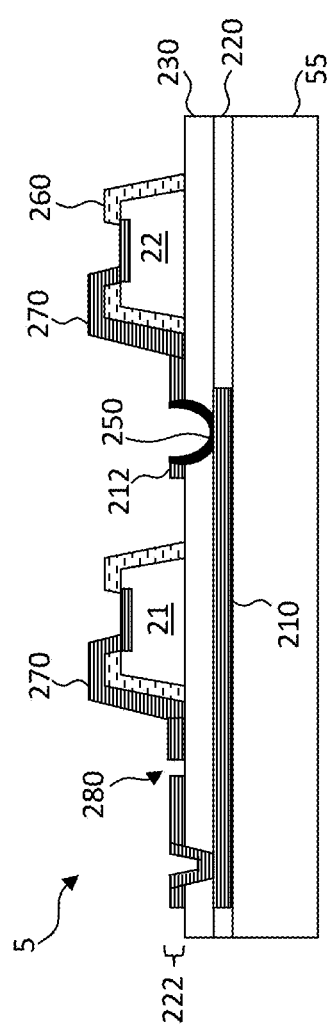
FIG. 14 is a cross section of a system according to illustrative embodiments of the present disclosure.

In some embodiments, first conductor 210 is continuous, for example electrically continuous and electrically connects a driver to a first circuit (e.g., as shown in FIG. 1). In some embodiments and as shown in FIG. 12 and in the FIG. 13 perspective, first conductor 210 is discontinuous having discontinuities 280 and does not electrically connect interface circuit 240 to first circuit 21. Discontinuities 280 in first conductor 210 can be cuts, gaps, or opens formed in first conductor 210 (e.g., by cutting). FIG. 14 is a cross section illustrating both a laser weld 250 and discontinuity 280. In some embodiments, first circuit 21, second circuit 22, or both first and second circuits 21, 22 can be integrated circuits, for example as shown in FIGS. 2, 3, 13, and 14. Integrated circuits can have at least a portion of a tether 290 such as a separated tether 290 or broken (e.g., fractured) tether 290.

In some embodiments, parallel redundant system 5 comprises two or more first conductors 210 disposed in first layer 220 and wire routed to first circuit 21 and two or more second conductors 212 disposed in second layer 222. Each second conductor 212 is electrically connected to second circuit 22. Similarly, multiple laser welds 250 and cuts (discontinuities 280) can be included in parallel redundant system 5, for example one laser weld 250 for each second conductor 212 and one discontinuity 280 for each first conductor 210. For example, power, ground, and data signals can all be used for first and second conductors 210, 212. Similarly output signals or device control signals can be used for first and second conductors 210, 212. Thus, in some embodiments, parallel redundant system 5 comprises two or more laser welds 250 each electrically connecting one of the two or more first conductors 210 to a corresponding one of the two or more second conductors 212.

It is not necessary that every first conductor 210 electrically connected to first circuit 21 is electrically connected to redundant second circuit 22 with a laser weld 250 and second conductor 212. In some embodiments, one or more of two or more first conductors 210 can be directly electrically connected to a corresponding one of two or more second conductors 212.

Figure 15:
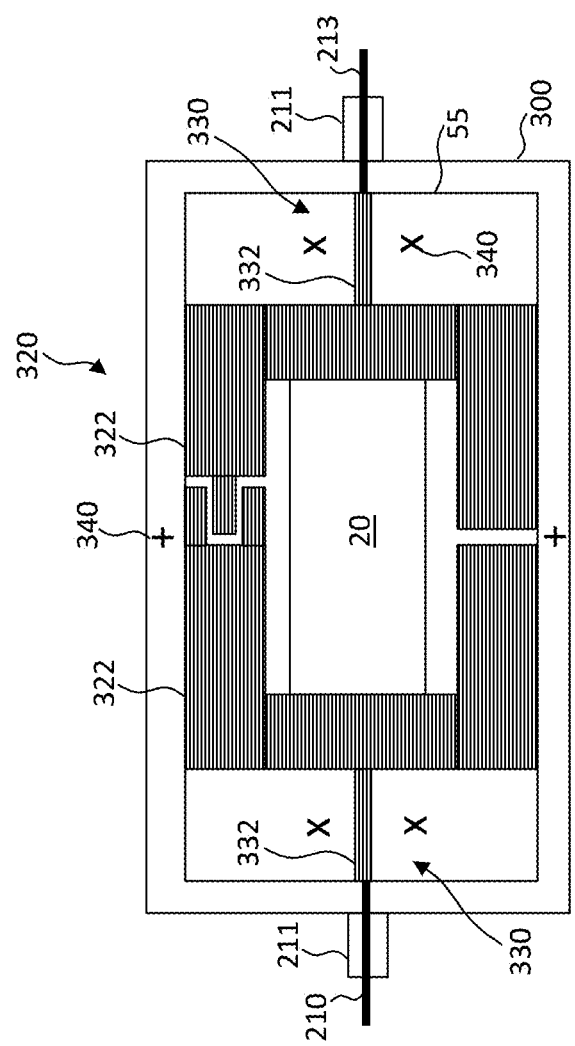
FIG. 15 is a plan view of a shorting structure according to illustrative embodiments of the present disclosure.

In some embodiments of the present disclosure, a first circuit 21 is faulty or defective, is misplaced or misaligned, or is missing and, in any case, fails to operate as desired. A variety of methods and structures can be provided to form a functional system despite any deficiencies of first circuit 21. Laser welds 250 can electrically connect first conductors 210 to second conductors 212 to provide redundant second circuit 22 that operates in place of deficient first circuit 21. In some embodiments of the present disclosure, first or second circuits 21, 22 for example formed in an integrated circuit 20 and optionally in a package 300 (e.g., a plastic or ceramic package), can be processed to provide an electrical short circuit or an electrical open between two or more first conductors 210 or two or more second conductors 212, or between one or more first conductors 210 and one or more second conductors 212, or any combination. In some embodiments, exposing first circuit 21 or second circuit 22 to a laser, for example to melt or cut first circuit 21 or second circuit 22, or an electrical conductor 322, 332 providing power or signals to first circuit 21 or second circuit 22, provides an electrical short circuit or electrical open. As shown in FIG. 15, to enable such processing, in some embodiments, an integrated circuit comprising an integrated circuit substrate 55 and first circuit 21 or second circuit 22 (generically circuit 20) can comprise a shorting structure 320 provided in the integrated circuit that, when exposed to laser radiation forms an electrical short, for example by melting metal conductors (electrical conductors 322) together. In some embodiments, an integrated circuit comprising first circuit 21 or second circuit 22 can comprise an opening structure 330 comprising an electrical conductor 332 (such as a thermally activated fuse) provided in the integrated circuit that, when exposed to laser radiation forms an electrical open. In some embodiments, an integrated circuit comprises both an opening structure 330 and a shorting structure 320, as shown in FIG. 15. In some embodiments, an integrated circuit comprises an opening structure 330 or comprises a shorting structure 320, but not both. The position or location of a shorting structure 320 or an opening structure 330 within an integrated circuit 20 (or other circuit) can be visually indicated with a graphic element 340 to assist in processing the circuit 20 to form the electrical short or open. A suitable graphic element 340 can be printed on package 300, for example with ink or paint.

Thus, according to some embodiments of the present disclosure, processable integrated circuit comprises an integrated circuit substrate 55 (also represented by integrated circuit 50 in certain Figures), a circuit 20 disposed in, on, or over the integrated circuit substrate 55 (e.g., shown in FIGS. 1, 13), and an electrical connector (e.g., first conductor 210) electrically connected to circuit 20. An opening structure 330 comprising an electrical conductor 322 is electrically connected in serial between electrical connector 210 and circuit 20, wherein opening structure 330 forms an electrical open when subjected to laser radiation (e.g., as shown in FIG. 15). Forming an electrical open by laser radiation includes providing sufficient power (e.g., having a minimum intensity, duration, and/or frequency) from a laser to form the electrical open (e.g., by local vaporization or melting).

An integrated circuit substrate 55 can be contained or mounted in a package 300 and an electrical connector 210 can comprise or be electrically connected to an interconnection lead 211. For example, the package 300 can be a plastic or ceramic IC package and the lead 211 can be a pin or pad disposed on or protruding from the package 300 that electrically connects to integrated circuit substrate 55 and circuit 20, for example through wire bonds. The opening structure 330 can be an electrical conductor 332 (e.g., a patterned metal conductor) disposed on, in, or over the integrated circuit substrate 55 or on or in package 300 or in a package cavity in which integrated circuit substrate 55 is disposed. The electrical conductor 322 electrically connects the interconnection lead 211 to circuit 20.

Opening structure 330 can comprise a thermally activated fuse. As used herein, a thermally activated fuse is or comprises an electrical conductor 322 that, when locally exposed to heat (e.g., by exposure to laser radiation) ceases to conduct electricity, for example because electrical conductor 332 melts or vaporizes.

In some embodiments of the present disclosure, a processable integrated circuit comprises an integrated circuit substrate 55, a circuit 20 disposed in, on, or over integrated circuit substrate 55, an electrical input connector 210 electrically connected to circuit 20, an electrical output connector 213 electrically connected to circuit 20, and a shorting structure 320 provided in electrical contact with electrical input connector 210 and provided in electrical contact with electrical output connector 213, wherein shorting structure 320 forms an electrical short when subjected to laser radiation. Forming an electrical short by laser radiation includes providing sufficient power (e.g., having a minimum intensity, duration, and/or frequency) from a laser to form the electrical short (e.g., by local melting). Shorting structure 320 can be disposed in, on, or over integrated circuit substrate 55 or on or in package 300 or in a package cavity in which integrated circuit substrate 55 is disposed. Electrical input connector 210 can be a package input lead and electrical output connector 213 can be a package output lead.

In some embodiments, shorting structure 320 comprises (i) a shorting conductor 322 electrically connected to input connector 210, shorting conductor 322 extending toward output connector 213 and separated from output connector 213 by a distance equal to or less than one mm, (ii) a shorting conductor 322 electrically connected to output connector 213, shorting conductor 322 extending toward input connector 210 and separated from input connector 210 by a distance equal to or less than one mm, or (iii) both (i) and (ii). Shorting conductor 322 can be interdigitated (e.g., as shown in the upper portion of shorting structure 320 in FIG. 15), or not (e.g., as shown in the lower portion of shorting structure 320 in FIG. 15). Interdigitating shorting conductor 322 can decrease the electrical resistance of the shorted conductor and the amount and accuracy of energy applied to shorting structure 320 to form the short. In some embodiments (i) shorting conductor 322 is separated from output connector 213 by a distance no more than 500 microns (e.g., no more than 100 microns, no more than 50 microns, or no more than 5 microns) or (ii) shorting conductor 322 is separated from input connector 210 by a distance no more than 500 microns (e.g., no more than 100 microns, no more than 50 microns, or no more than 5 microns). Closer distances reduce the energy required to short shorting structure 320, but require improved process resolution.

In some embodiments, first circuit 21 can be removed from substrate 55 so that first circuit 21 is not on substrate 55, for example by processing first circuit 21 with laser radiation. In some embodiments, first circuits 21 disposed on (e.g., micro-transfer printed to) substrate 55, heating the circuit can provide enough thermal energy that the circuit pops off substrate 55 and can be removed from parallel redundant system 5. In some embodiments, heating an integrated circuit 20 (e.g., by subjecting the integrated circuit 20 to laser radiation) can vaporize a portion of integrated circuit 20 forming a shock wave that mechanically displaces integrated circuit 20. In some embodiments, heat can also melt or vaporize an adhesive adhering circuit 20 to substrate 55. Micro-transfer printed integrated circuits 20 have been successfully removed by laser from a substrate 55.

Thus, in some embodiments of the present disclosure, a method for processing an integrated circuit comprises providing a substrate 55 and an integrated circuit 50 disposed on the substrate 55 and locally heating integrated circuit 50 such that integrated circuit 50 is removed from substrate 55 (e.g., due, at least in part, to a force generated by a shock wave produced by local heat). By locally heating it is meant that not all of parallel redundant system 5 is heated, for example the step of heating can comprise exposing the integrated circuit 50 to laser radiation and, for example not directly exposing substrate 55 to laser radiation. Integrated circuit 50 can be an unpackaged die and can have at least one dimension of no more than 200 microns (e.g., no more than 100 microns, no more than 50 microns, no more than 20 microns, no more than 10 microns, or no more than 5 microns). Integrated circuit 50 can be adhered to substrate 55 with an adhesive before heating integrated circuit 50 and the step of heating integrated circuit 50 can heat the adhesive (e.g., causing it to vaporize).

Figure 16:
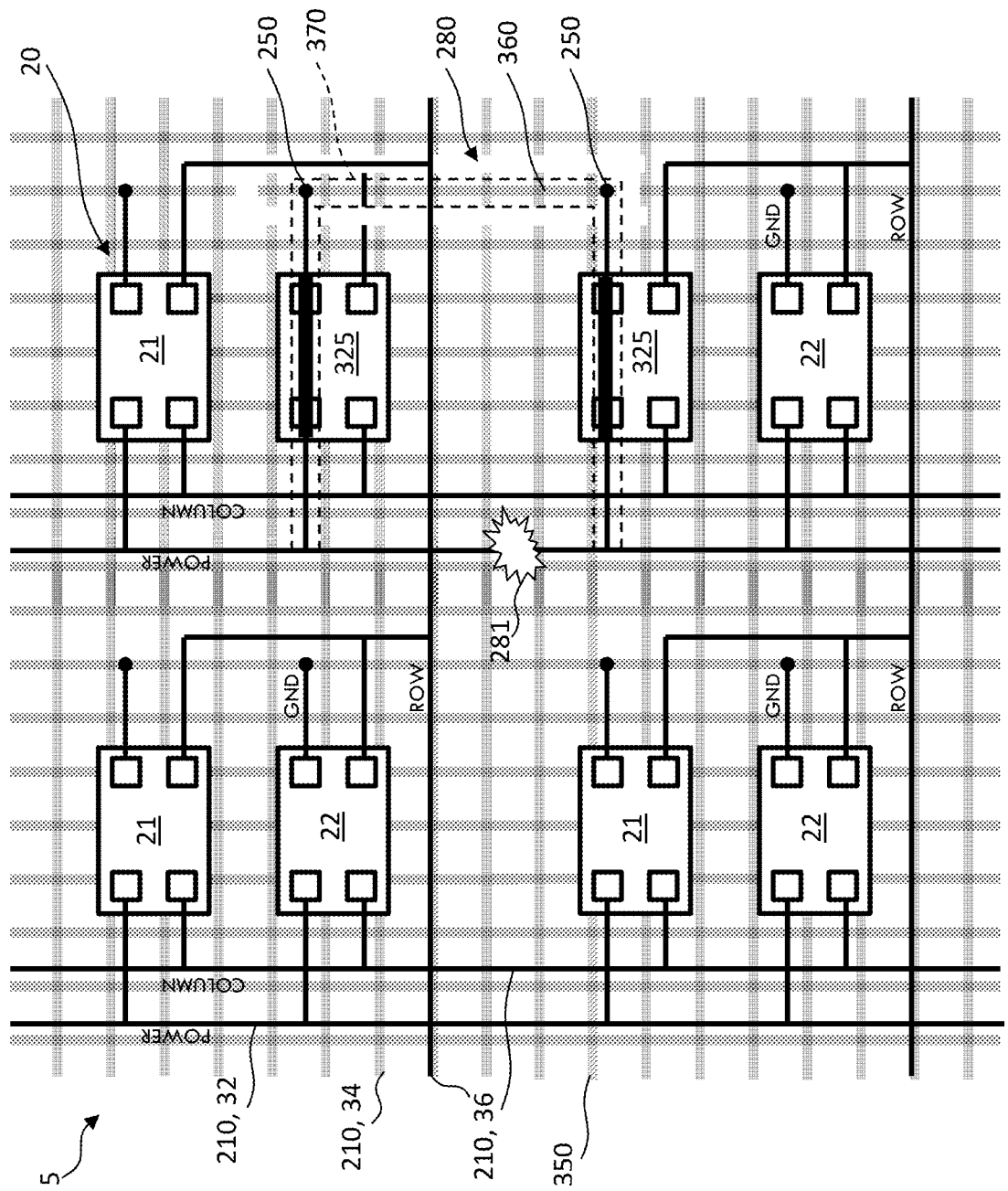
FIG. 16 is a schematic diagram according to illustrative embodiments of the present disclosure.

In some embodiments of the present disclosure, laser welds 250 and discontinuities 280 can be used in methods and structures for re-routing signals around broken conductors. Referring to FIG. 16, each first circuit 21 in an array of first circuits 21 has an associated redundant second circuit 22. The circuits 20 are arranged in an active-matrix structure with row and column control conductors (e.g., wires, connections) together with power and ground connections 32, 34. Ground connections 34 are provided in a ground mesh (a mesh-connected conductive plane 350) to provide an improved ground signal and enable re-routing. As shown in FIG. 16, a broken wire 281 (e.g., an inadvertent and undesired discontinuity, for example due to process errors or particle contamination during manufacture) prevents the distribution of power to some circuits 20 (at the bottom right of FIG. 16). This structural flaw in parallel redundant system 5 can be mitigated by cutting portions of mesh-connected conductive plane 350 forming electrical discontinuities 280 in mesh-connected conductive plane 350, thus defining a repair conductor 370. Two circuits 20 can be processed to form circuit shorts, as indicated with a bar, thereby forming shorted integrated circuits 325 and providing a repair conductor 370 around broken wire 281 thereby repairing parallel redundant system 5.

According to some embodiments of the present disclosure, a parallel redundant system 5 comprises a substrate 55 and a wire (e.g., first conductor 210) disposed on, over, or in substrate 55, wire 210 comprising a conductive break (broken wire 281). A mesh-connected conductive plane 350 is disposed on, over, or in substrate 55. The mesh-connected conductive plane 350 comprises discontinuities (cuts) 280 (i.e., is a cut mesh-connected conductive plane 350) that define a conductive path 360 electrically isolated from the cut mesh-connected conductive plane 350. A repair conductor 370 comprises conductive path 360 and conducts electricity from one side of conductive break 281 to another side of conductive break 281, indicated with dashed lines in FIG. 16, thereby providing electrical continuity to wire 210.

Repair conductor 370 can comprise, for example, one or more laser welds 250 or one or more shorted integrated circuits 350. Mesh-connected conductive plane 350 can comprise a two-dimensional array of conductors. Mesh-connected conductive plane 350 can be a ground plane or a power plane but is not a continuous plane. Rather a mesh-connected conductive plane 350 comprises electrically connected conductors (e.g., wires or traces) disposed in a common plane, for example in a first array extending in a first direction (e.g., a horizontal direction) and in a second array extending in a second direction different from the first direction (e.g., in a vertical direction). Where the wires in the arrays overlap, they are electrically connected.

In some embodiments of the present disclosure, multiple mesh-connected conductive planes 350 are provided. Mesh-connected conductive plane 350 can be a first mesh-connected conductive plane 350, conductive path 360 can be a first conductive path, and a parallel redundant system 5 according to some embodiments can comprise a second mesh-connected conductive plane 350 disposed on, in, or over substrate 55. Second mesh-connected conductive plane 350 can comprise cuts different or the same as discontinuities (cuts) 280 in first mesh-connected conductive plane 350 that define a second conductive path 360 electrically isolated from the second mesh-connected conductive plane 350.

Wire 210 can be a first wire 210 having a first conductive break 281, repair conductor 370 can be a first repair conductor 370, and some embodiments can comprise a second wire 210 comprising a second conductive break 281 and a second repair conductor 370 comprising second conductive path 360. Second repair conductor 370 conducts electricity from one side of second conductive break 281 to another side of second conductive break 281, thereby providing electrical continuity to second wire 210.

First mesh-connected conductive plane 350 can be a power plane and second mesh-connected conductive plane 350 can be a ground plane, and the power plane and the ground plane can be electrically isolated (e.g., insulated) from each other.

Figure 11E:
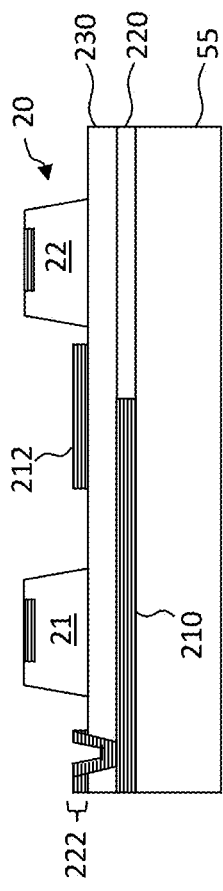
Figure 11F:
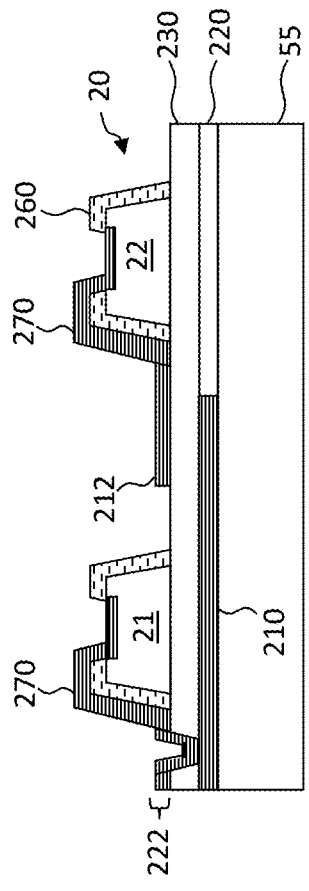
Figure 11G:
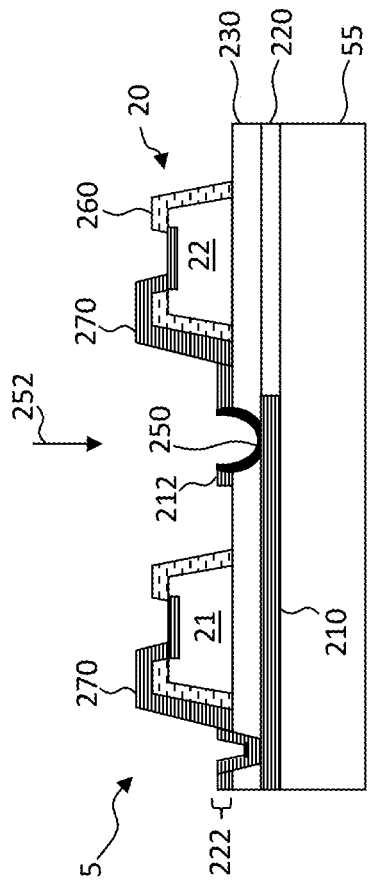

Referring to FIG. 17 and also to FIGS. 11A-11F (which, for simplicity, show only one pair of redundant circuits 20), a method of making a parallel redundant system 5 comprises providing a substrate 55, circuits 20, and first and second conductors 210, 212 in step 400. A substrate 55 is provided, for example a display substrate comprising glass, plastic, ceramic, or semiconductor material, as shown in FIG. 11A. As shown in FIG. 11B, at least a portion of patterned first conductors 210 (at least a portion of one first conductor 210 being shown in FIG. 11B) are disposed in a first layer 220 over, on, or in substrate 55, for example using photolithographic deposition and patterning methods such as evaporation, photoresist materials exposed in a pattern, and etching, for example. Dielectric layer 230 is deposited, for example by coating a layer of polymer (e.g., SU-8) over substrate 55, covering the at least a portion of first conductors 210 in first layer 220 (e.g., as shown in FIG. 11C). In this example, a portion of dielectric layer 230 is in first layer 220. Patterned second conductors 212 are disposed in a second layer 222 over, on, or in dielectric layer 230, for example using photolithographic deposition and patterning methods such as evaporation, photoresist materials exposed in a pattern, and etching as shown in FIG. 11D (e.g., so that dielectric layer 230 is disposed at least partially between the first conductor and the second conductor). Vias through dielectric layer 230 can be formed (e.g., as shown in FIG. 11D) so that a portion of first conductors 210 can be disposed through dielectric layer 230 to provide electrical connections from the at least a portion first conductors 210 disposed in first layer 220 to first circuits 21 when disposed (e.g., as shown in FIGS. 11E and 11F). As shown in FIG. 11D (and FIGS. 11E and 11F), at least a portion of first conductors 210 can be formed in second layer 222 to enable electrical connection of first circuits 21 (e.g., to a display controller 80 or interface circuit 240). Referring next to FIG. 11E, first and second circuits 21, 22 are disposed on, in, or over substrate 55, first layer 220, dielectric layer 230, or second layer 222, for example by micro-transfer printing integrated circuits 20. The integrated circuits 20 can comprise broken (e.g., fractured) tethers 290 (e.g., as shown in FIG. 13) as a consequence of micro-transfer printing. As shown in FIG. 11F, patterned insulating dielectric structures 260 and electrodes 270 electrically connecting first circuit 21 to first conductor 210 and electrically connecting second circuit 22 to second conductor 212 can be formed using conventional photolithographic materials and methods.

Referring again to FIG. 17, each first circuit 21 can be tested in step 410, for example by a display controller 80 (shown in FIG. 6) electrically connected to and driving first and second conductors 210, 212, or by optical imaging, or both in combination. If (step 420) first circuits 21 are all functional (none are defective, misplaced, misaligned, or missing), the process is done (step 490). If, however, one or more first circuits 21 are not functional, second conductor 212 can be laser welded in step 430 to first conductor 210 to enable signals to be provided to second circuit 22 and render second circuit 22 functional in the place of non-functional first circuit 21 (e.g., as shown in FIG. 11G and FIG. 14). In some embodiments of the present disclosure, second circuit 22 is disposed on, over, or in substrate 55 after first circuit 21 is tested (step 410) and either before or after laser weld 250 is formed.

In optional step 440, first conductor 210 can be cut, for example with a laser, as shown in FIGS. 12-14. Cutting one or more first conductors 210 between laser weld 250 and first circuit 21 along the path current flows during operation can electrically isolate first circuit 21 from the rest of parallel redundant system 5. In some options, first circuit 21 is removed from parallel redundant system 5 (step 445), also electrically isolating first circuit 21 from parallel redundant system 5. Removing a first circuit 21 from a parallel redundant integrated-circuit system 5 can be advantageous in that a misplaced, misaligned, or defective first circuit 21 that is left in place may still transmit abnormal (e.g., intermittent, partial, or corrupted) signals that undesirably interfere with performance of a second circuit 22. In some embodiments, for example as shown in FIG. 18, first circuit 21 is processed, for example with a laser, to form an electrical open in step 442, thereby isolating first circuit 221 from parallel redundant system 5. Any combination of one or more of steps 440, 445, and 442 can be used in a method according to some embodiments of the present disclosure and can be performed in any order. Likewise, laser welding (step 430) can be performed before or after one or more of steps 440, 445, and 442, for example to reduce any problems with electrostatic discharge.

Figure 19:
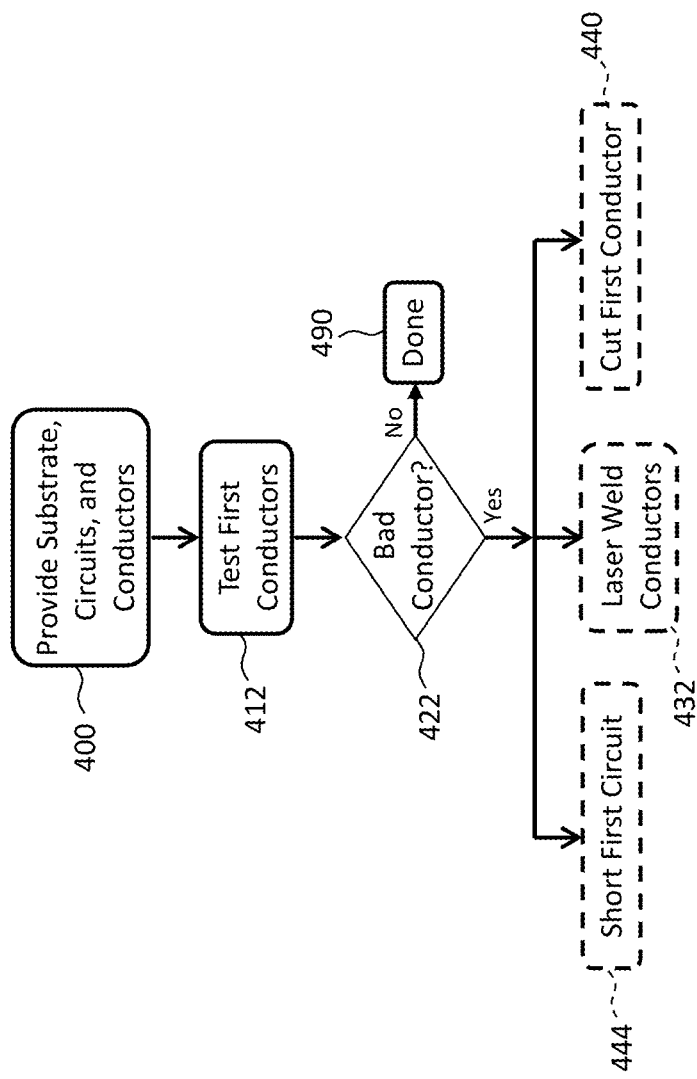

In some embodiments of the present disclosure, referring to FIGS. 16 and 19, substrate 55, circuits 20, and first and second conductors 210, 212 are provided in step 400 as described above. First conductors 210 are tested in step 412, for example by testing parallel redundant system 5 with a display controller 80 (e.g., as shown in FIG. 6) electrically connected to and driving first and second conductors 210, 212, or with optical imaging, or with both in combination. If (step 422) all of first conductors 210 are properly functional, the process is done (step 490). If a first conductor 210 is bad (does not function as desired) and an undesired and inadvertent discontinuity (e.g., a broken wire 281) is discovered, a conductive path can be formed around the break by any one or more of shorting a first circuit 21 in step 444, laser welding first conductors to each other in step 432, laser welding second conductors 212 to each other, or laser welding first conductors 210 to second conductors 212 to form laser welds 250. First conductors 210 or second conductors 212 can also be cut in step 440, for example as illustrated in FIG. 16.

In some embodiments of the present disclosure, a method for processing an integrated circuit comprises providing an integrated circuit substrate 50, a circuit 20 disposed in, on, or over integrated circuit substrate 50, an electrical connector (e.g., first conductor 210) electrically connected to circuit 20, and an opening structure 330 electrically connected in serial between electrical connector 210 and circuit 20, and exposing opening structure 330 to laser radiation, thereby forming an electrical open between circuit 20 and electrical connector 210.

Likewise, in some embodiments of the present disclosure, a method for processing an integrated circuit comprises providing an integrated circuit substrate 50, a circuit 20 disposed in, on, or over integrated circuit substrate 50, an electrical input connector 210 electrically connected to circuit 20, an electrical output connector 213 electrically connected to circuit 20, and a shorting structure 320 provided in electrical contact with electrical input connector 210 and in electrical contact with electrical output connector 213, and exposing shorting structure 322 to laser radiation, thereby forming an electrical short between electrical input connector 210 and electrical output connector 213.

Figure 20:
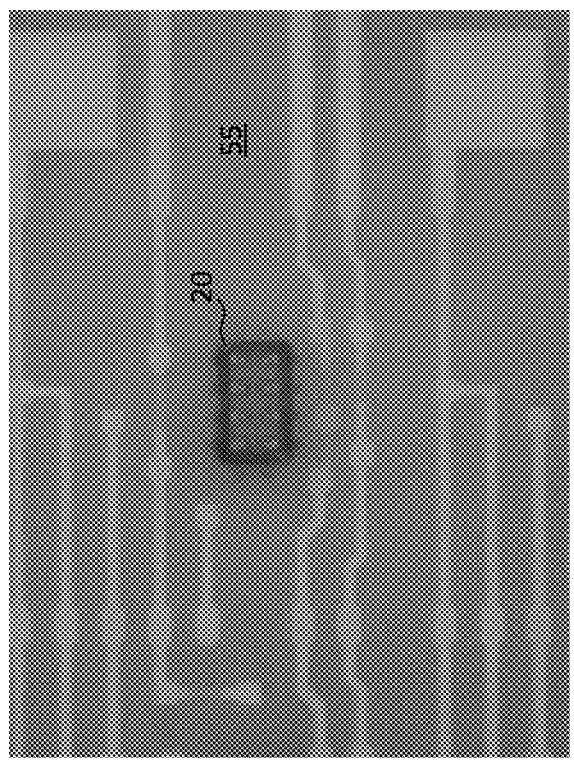
FIG. 20 is a micrograph useful in understanding illustrative embodiments.
Figure 21B:
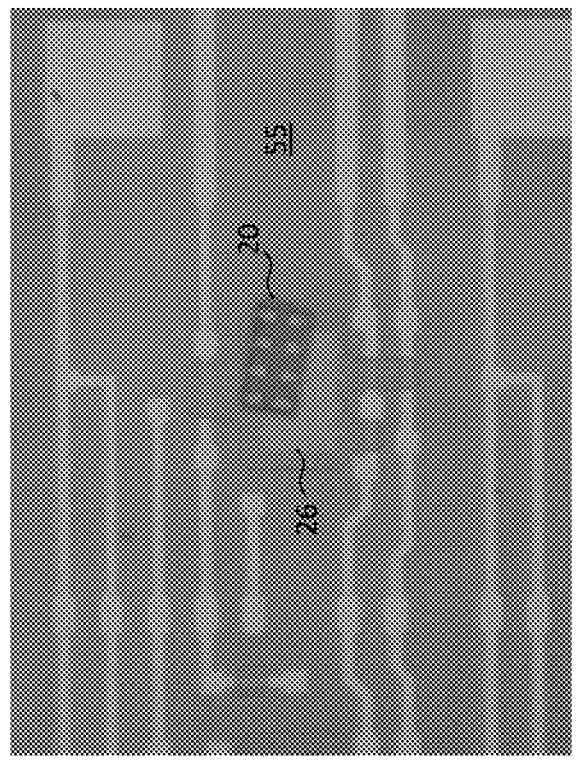
FIG. 21A is a bottom-view micrograph and FIG. 21B is a top-view micrograph of a constructed illustrative embodiment of the present disclosure.
Figure 21A:
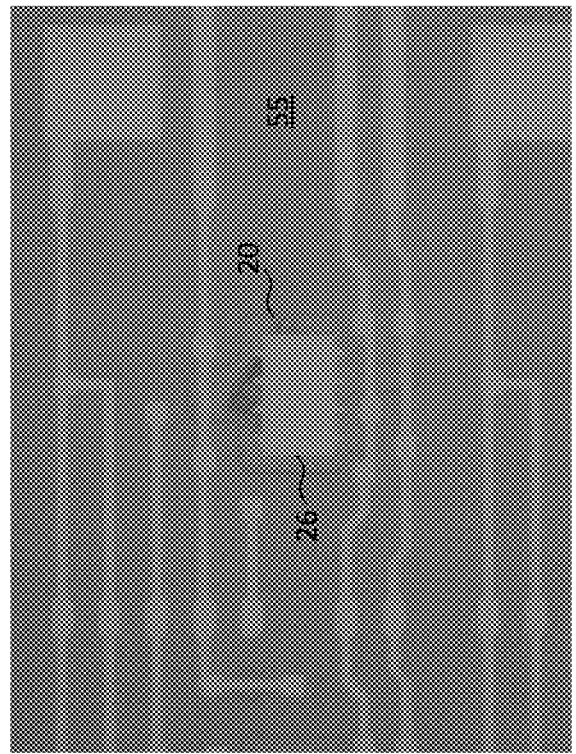
Figure 22A:
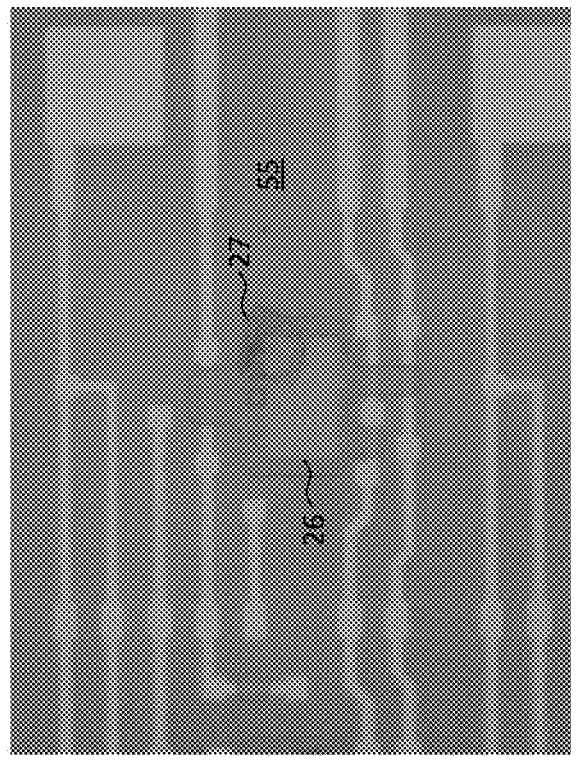
FIG. 22A is a bottom-view micrograph and FIG. 22B is a top-view micrograph of a constructed illustrative embodiment of the present disclosure.
Figure 22B:
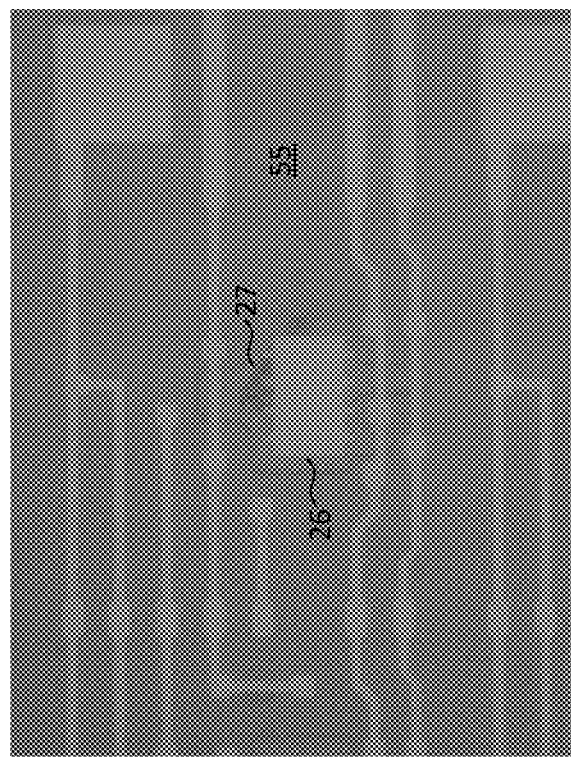

FIG. 20 is a micrograph of a properly micro-transfer printed integrated circuit 20 on a substrate 55. The integrated circuit 20 is properly aligned and electrically connected and does not require a redundant circuit 20. In contrast, referring to the micrographs of FIG. 21A in a bottom view through substrate 55 and FIG. 21B in a top view, a micro-transfer printed integrated circuit 20 is misaligned with substrate circuitry, substrate 55, and a light shield 26 between circuit 20 and substrate 55. Referring to the micrographs of FIG. 22A in a bottom view through substrate 55 and FIG. 22B in a top view, the micro-transfer printed integrated circuit 20 is removed by exposing it to a burst of laser light directed onto circuit 20 adjacent to light shield 26. The energy absorbed by integrated circuit 20 causes it to pop off from substrate 55. In some embodiments, removal of an integrated circuit 20 leaves a blemish 27 of some dielectric material (e.g., adhesive), as discussed above with respect to step 445. A blemish 27 can be formed, for example, due to vaporization of a portion of some dielectric material during laser induced heating.

Figure 23:
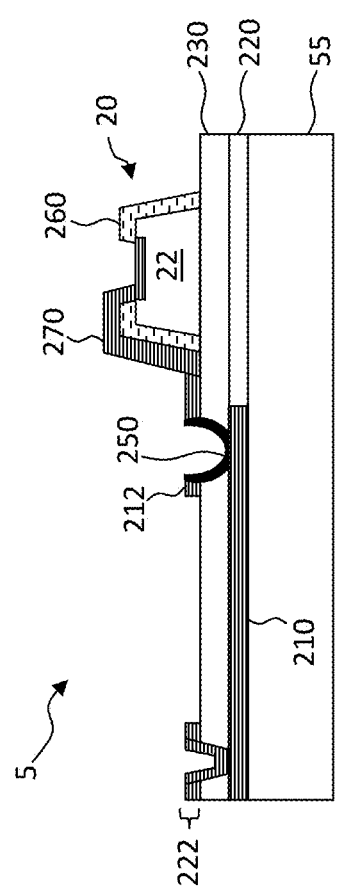
FIG. 23 is a cross-section view of a parallel redundant integrated-circuit system where a first circuit has been removed, according to illustrative embodiments of the present disclosure.

In some embodiments, and as shown for example in FIG. 23, a first circuit 21 has been removed from a parallel redundant integrated-circuit system 5 using laser light. Referring to FIG. 23, a second circuit 22 is electrically connected to a second conductor 212, which is electrically connected through a dielectric layer 230 to a first conductor 210 with a laser weld 250. Removing a first circuit 21 from a parallel redundant integrated-circuit system 5 can be advantageous in that a misplaced, misaligned, or defective first circuit 21 that is left in place may still transmit abnormal (e.g., intermittent, partial, or corrupted) signals that undesirably interfere with performance of a second circuit 22. A misplaced, misaligned, or defective first circuit 21 that is left in place may also or alternatively undesirably use power or form unintentional short circuits. Removing the first circuit 21 prevents transmission of electrical signals (and/or use of power) by disrupting an electrical path between an input connection 30 and an output connection 40. In some embodiments, cutting one or more conductors or forming an electrical open is sufficient to prevent transmission of abnormal signals.

The use of a laser to cut conductors on or over a substrate, to weld conductors on separated layers, and to remove circuits 20 has been reliably demonstrated in accordance with embodiments of the present disclosure. U.S. Pat. No. 7,417,692 discloses such techniques for thin-film circuits in liquid-crystal displays and cutting, welding, and defect removals are described in *Flat Panel Display Defect Repair Using High Peak-Power Picosecond Lasers*, referenced above.

In some embodiments, integrated circuits 50 are formed in substrates or on supports separate from the display substrate 55. For example, light emitters 60 are separately formed in a semiconductor wafer. The light emitters 60 are then removed from the wafer and transferred, for example using micro transfer printing, to the display substrate 55. This arrangement has the advantage of using a crystalline semiconductor substrate that provides higher-performance integrated circuit components than can be made in the amorphous or polysilicon semiconductor available on a large substrate such as the display substrate 55.

By employing a multi-step transfer or assembly process, increased yields are achieved and thus reduced costs for a parallel redundant integrated-circuit system 5 of the present disclosure. Additional details useful in understanding and performing aspects of the present disclosure are described in U.S. Pat. No. 9,520,537 referenced above.

As is understood by those skilled in the art, the terms "over" and "under" are relative terms and can be interchanged in reference to different orientations of the layers, elements, and substrates included in various embodiments of the present disclosure. Furthermore, a first layer or first element "on" a second layer or second element, respectively, is a relative orientation of the first layer or first element to the second layer or second element, respectively, that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact).

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the following claims.

PARTS LIST 5 parallel redundant integrated-circuit system/parallel redundant system
10 component group
11 red-light component group
12 green-light component group
13 blue-light component group
20 active circuit/circuit
21 first active circuit/first circuit
22 second active circuit/second circuit
23 third active circuit
25 transistor
26 light shield
27 dielectric blemish
30 input connection 32 power connection
34 ground connection
36 signal connection
40 output connection
50 integrated circuit/chiplet/integrated circuit substrate
51 first integrated circuit
52 second integrated circuit
53 first pixel substrate
54 second pixel substrate
55 backplane/display substrate/substrate
60 light emitter
60R red-light emitter/integrated circuit
60G green-light emitter/integrated circuit
60B blue-light emitter/integrated circuit
61R first red-light emitter/integrated circuit
61G first green-light emitter/integrated circuit
61B first blue-light emitter/integrated circuit
62R second red-light emitter/integrated circuit
62G second green-light emitter/integrated circuit
62B second blue-light emitter/integrated circuit
65 redundant full-color pixel
80 controller/display controller
82 column driver
84 memory
90 storage element
90R red storage element
90G green storage element
90B blue storage element
92 driver circuit
92R red driver circuit
92G green driver circuit
92B blue driver circuit
100 provide circuit system step
110 provide controller step
120 provide optical metrology system step
130 provide uniform control signals step
140 measure light output and calibrate step
150 provide calibrated control signals step
210 first conductor/electrical connector/electrical input connector/wire
211 interconnection lead
212 second conductor
213 electrical output connector
220 first layer
222 second layer
230 dielectric layer
240 interface circuit
250 laser weld
252 laser radiation
260 dielectric structure
270 electrode
280 discontinuity/cut
281 broken wire/conductive break
290 tether
300 package
320 shorting structure
322 electrical conductor/shorting conductor
325 shorted integrated circuit
330 opening structure
332 electrical conductor/thermally activated fuse
340 graphic
350 mesh-connected conductive plane
360 conductive path
370 repair conductor
400 provide substrate, circuits, and conductors step
410 test first circuits step
412 test first conductor step
420 evaluate circuit test step
422 evaluate conductor test step
430 laser weld first and second conductors step
432 laser weld conductors step
440 cut first conductor step
442 open first circuit step
445 remove first circuit step

What is claimed:

1. A parallel redundant system, comprising:
a substrate;
a first circuit disposed over the substrate;
a first conductor disposed at least partially in a first layer over the substrate and wire routed to the first circuit;
a second circuit disposed over the substrate, the second circuit redundant to the first circuit;
a second conductor disposed in a second layer over the substrate and electrically connected to the second circuit, the second conductor disposed at least partially over the first conductor;
a dielectric layer disposed at least partially between the first layer and the second layer; and
a laser weld electrically connecting the first conductor to the second conductor through the dielectric layer, wherein the laser weld comprises melted and fused metal,
wherein the first conductor and the second conductor are a common input or a common output connection for the first circuit and for the second circuit.

2. The parallel redundant system of claim 1, comprising an interface circuit electrically connected to the first conductor and to the second circuit through the laser weld.

3. The parallel redundant system of claim 2, wherein the first conductor is continuous and electrically connects the interface circuit to the first circuit.

4. The parallel redundant system of claim 2, wherein the first conductor is discontinuous and does not electrically connect the interface circuit to the first circuit.

5. The parallel redundant system of claim 1, wherein at least one of the first circuit and the second circuit is an integrated circuit.

6. The parallel redundant system of claim 5, wherein the integrated circuit comprises an unpackaged semiconductor circuit and a broken tether.

7. The parallel redundant system of claim 5, wherein the integrated circuit comprises an opening structure.

8. The parallel redundant system of claim 5, wherein the integrated circuit comprises a metallic shorting structure.

9. The parallel redundant system of claim 1, comprising two or more first conductors disposed in the first layer wire routed to the first circuit and two or more second conductors disposed in the second layer each second conductor electrically connected to the second circuit.

10. The parallel redundant system of claim 9, comprising two or more laser welds, each of the two or more laser welds electrically connecting one of the two or more first conductors to a corresponding one of the two or more second conductors.

11. The parallel redundant system of claim 9, wherein one or more of the two or more first conductors is electrically connected to a corresponding one of the two or more second conductors.

12. The parallel redundant system of claim 9, wherein the first circuit provides an electrical short circuit or an electrical open between two of the two or more first conductors, two or more second conductors, or between one or more first conductors and one or more second conductors.

13. A method of making a parallel redundant system, comprising:
- providing a substrate, a first circuit disposed over the substrate, a second circuit disposed over the substrate, a first conductor disposed at least partially in a first layer over the substrate and wire routed to the first conductor, a second conductor disposed in a second layer over the substrate and electrically connected to the second circuit, the second conductor at least partially over the first conductor, and a dielectric layer disposed at least partially between the first layer and the second layer such that the first conductor is electrically insulated from the second conductor; and
- laser welding the first conductor to the second conductor where the second conductor is over the first conductor to form a laser weld that electrically connects the second conductor to the first conductor through the dielectric layer, wherein laser welding comprises heating the dielectric and first and second conductors thereby forming an opening in the dielectric layer and melting and fusing metal connecting the second conductor to the first conductor through the opening in the dielectric layer,
- wherein the first conductor and the second conductor are a common input or a common output connection for the first circuit and for the second circuit.

14. The method of claim 13, comprising testing the first circuit and laser welding if the first circuit is determined to be at least one of defective, misplaced, misaligned, and missing.

15. The method of claim 13, comprising cutting the first conductor.

16. The method of claim 15, comprising cutting the first conductor between the laser weld and the first circuit along a current path of the first conductor.

17. The method of claim 15, wherein the first conductor is cut before laser welding.

18. The method of claim 15, wherein the first conductor is cut after laser welding.

19. The method of claim 15, comprising (i) disposing the first circuit over the substrate by micro-transfer printing the first circuit, (ii) disposing the second circuit over the substrate by micro-transfer printing the second circuit, or (iii) both (i) and (ii).

20. The method of claim 13, comprising testing the first circuit and disposing the second circuit over the substrate after the first circuit is tested.

21. The method of claim 13, comprising providing two or more first conductors and the method comprises processing the first circuit to form a metallic short circuit between two of the two or more first conductors.

22. The method of claim 13, comprising providing two or more first conductors and the method comprises processing the first circuit to form an open between two of the two or more first conductors.

23. The method of claim 13, wherein the first circuit is disposed on the substrate and the method comprises removing the first circuit from the substrate.

24. A method of making a parallel redundant system, comprising:
- providing a substrate, a first circuit disposed over the substrate, a second circuit disposed over the substrate, a first conductor disposed at least partially in a first layer over the substrate and wire routed to the first conductor, a second conductor disposed in a second layer over the substrate and electrically connected to the second circuit, the second conductor at least partially over the first conductor, and a dielectric layer disposed at least partially between the first layer and the second layer such that the first conductor is electrically insulated from the second conductor;
- laser welding the first conductor to the second conductor where the second conductor is over the first conductor to form a laser weld that electrically connects the second conductor to the first conductor through the dielectric layer; and
- cutting the first conductor between the laser weld and the first circuit along a current path of the first conductor.

25. A parallel redundant system, comprising:
- a substrate;
- a first circuit disposed over the substrate;
- two or more first conductors disposed at least partially in a first layer over the substrate, each first conductor of the two or more first conductors wire routed to the first circuit;
- a second circuit disposed over the substrate, the second circuit redundant to the first circuit;
- two or more second conductors disposed in a second layer over the substrate, the second conductor disposed at least partially over the first conductor, each second conductor of the two or more second conductors electrically connected to the second circuit;
- a dielectric layer disposed at least partially between the first layer and the second layer; and
- two or more laser welds, each of the two or more laser welds electrically connecting one of the two or more first conductors to a corresponding one of the two or more second conductors through the dielectric layer, wherein the laser weld comprises melted and fused metal.

26. A method of making a parallel redundant system, comprising:
- providing a substrate, a first circuit disposed over the substrate, a second circuit disposed over the substrate, a first conductor disposed at least partially in a first layer over the substrate and wire routed to the first conductor, a second conductor disposed in a second layer over the substrate and electrically connected to the second circuit, the second conductor at least partially over the first conductor, and a dielectric layer disposed at least partially between the first layer and the second layer such that the first conductor is electrically insulated from the second conductor;
- laser welding the first conductor to the second conductor where the second conductor is over the first conductor to form a laser weld that electrically connects the second conductor to the first conductor through the dielectric layer, wherein laser welding comprises heating the dielectric and first and second conductors thereby forming an opening in the dielectric layer and melting and fusing metal connecting the second conductor to the first conductor through the opening in the dielectric layer;
- cutting the first conductor between the laser weld and the first circuit along a current path of the first conductor.

* * * * *